United States Patent
Ferrant et al.

(10) Patent No.: US 7,187,581 B2
(45) Date of Patent: Mar. 6, 2007

(54) SEMICONDUCTOR MEMORY DEVICE AND METHOD OF OPERATING SAME

(75) Inventors: Richard Ferrant, Esquibien (FR); Serguei Okhonin, Lausanne (CH); Eric Carman, Cernex (FR); Michel Bron, Lausanne (CH)

(73) Assignee: Innovative Silicon S.A., Lausanne (CH)

( * ) Notice: Subject to any disclaimer, the term of this patent is extended or adjusted under 35 U.S.C. 154(b) by 157 days.

(21) Appl. No.: 11/079,590

(22) Filed: Mar. 14, 2005

(65) Prior Publication Data
US 2005/0157580 A1 Jul. 21, 2005

Related U.S. Application Data

(62) Division of application No. 10/840,009, filed on May 6, 2004, now abandoned.

(60) Provisional application No. 60/470,384, filed on May 13, 2003, provisional application No. 60/470,318, filed on May 13, 2003.

(51) Int. Cl.
*G11C 11/34* (2006.01)
*G11C 7/00* (2006.01)

(52) U.S. Cl. .................. 365/177; 365/63; 365/189.01; 365/181; 365/230.03

(58) Field of Classification Search ................ 365/177, 365/181, 63, 189.01, 230.03
See application file for complete search history.

(56) References Cited

U.S. PATENT DOCUMENTS 3,439,214 A    4/1969 Kabell (Continued)

FOREIGN PATENT DOCUMENTS

EP    0 030 856    6/1981

(Continued)

OTHER PUBLICATIONS

"Dynamic floating body control SOI CMOS for power managed multimedia ULSIs", Morishita et al., Proc. CICC, pp. 263-266, 1997.

(Continued)

*Primary Examiner*—Son T. Dinh
(74) *Attorney, Agent, or Firm*—Neil A. Steinberg

(57) ABSTRACT

There are many inventions described and illustrated herein. In a first aspect, the present invention is directed to a memory device and technique of reading data from and writing data into memory cells of the memory device. In this regard, in one embodiment of this aspect of the invention, the memory device and technique for operating that device that minimizes, reduces and/or eliminates the debilitating affects of the charge pumping phenomenon. This embodiment of the present invention employs control signals that minimize, reduce and/or eliminate transitions of the amplitudes and/or polarities. In another embodiment, the present invention is a semiconductor memory device including a memory array comprising a plurality of semiconductor dynamic random access memory cells arranged in a matrix of rows and columns. Each semiconductor dynamic random access memory cell includes a transistor having a source region, a drain region, a electrically floating body region disposed between and adjacent to the source region and the drain region, and a gate spaced apart from, and capacitively coupled to, the body region. Each transistor includes a first state representative of a first charge in the body region, and a second data state representative of a second charge in the body region. Further, each row of semiconductor dynamic random access memory cells includes an associated source line which is connected to only the semiconductor dynamic random access memory cells of the associated row.

23 Claims, 32 Drawing Sheets

U.S. PATENT DOCUMENTS

| | | |
|---|---|---|
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,791,610 A | 12/1988 | Takemae |
| 4,979,014 A | 12/1990 | Hieda et al. |
| 5,144,390 A | 9/1992 | Matloubian |
| 5,164,805 A | 11/1992 | Lee |
| 5,258,635 A | 11/1993 | Nitayama et al. |
| 5,388,068 A | 2/1995 | Ghoshal et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,528,062 A | 6/1996 | Hsieh et al. |
| 5,568,356 A | 10/1996 | Schwartz |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,696,718 A | 12/1997 | Hartmann |
| 5,740,099 A | 4/1998 | Tanigawa |
| 5,778,243 A | 7/1998 | Aipperspach et al. |
| 5,780,906 A | 7/1998 | Wu et al. |
| 5,784,311 A | 7/1998 | Assaderaghi et al. |
| 5,811,283 A | 9/1998 | Sun |
| 5,877,524 A * | 3/1999 | Oonakado et al. .......... 257/321 |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 6,018,172 A | 1/2000 | Hidaka et al. |
| 6,081,443 A | 6/2000 | Morishita |
| 6,096,598 A | 8/2000 | Furukawa et al. |
| 6,097,056 A | 8/2000 | Hsu et al. |
| 6,111,778 A | 8/2000 | MacDonald et al. |
| 6,121,077 A | 9/2000 | Hu et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,708 B1 | 1/2001 | Kuang et al. |
| 6,214,694 B1 | 4/2001 | Leobandung et al. |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,331,465 B1 | 12/2001 | Forbes et al. |
| 6,333,532 B1 | 12/2001 | Davari et al. |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,476,441 B2 | 11/2002 | Geusic et al. |
| 6,479,862 B1 | 11/2002 | King et al. |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,556,477 B2 | 4/2003 | Hsu et al. |
| 6,566,177 B1 | 5/2003 | Radens et al. |
| 6,567,330 B2 | 5/2003 | Fujita et al. |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,661,042 B2 | 12/2003 | Hsu |
| 6,714,436 B1 | 3/2004 | Burnett et al. |
| 6,721,222 B2 | 4/2004 | Somasekhar et al. |
| 6,771,546 B2 | 8/2004 | Ikehashi et al. |
| 6,778,424 B2 | 8/2004 | Iwata et al. |
| 6,781,875 B2 | 8/2004 | Ohsawa |
| 6,861,689 B2 | 3/2005 | Burnett |
| 6,897,098 B2 | 5/2005 | Hareland et al. |
| 6,903,984 B1 | 6/2005 | Tang et al. |
| 6,909,151 B2 | 6/2005 | Hareland et al. |
| 6,913,964 B2 | 7/2005 | Hsu |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Wantanabe et al. |
| 2002/0180089 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146488 A1 | 8/2003 | Nagano et al. |
| 2003/0151112 A1 | 8/2003 | Yamada et al. |
| 2003/0168677 A1 | 9/2003 | Hsu |
| 2003/0213994 A1 | 11/2003 | Hayashi et al. |
| 2004/0021137 A1 | 2/2004 | Fazan et al. |
| 2004/0041206 A1 | 3/2004 | Bhattacharyya |
| 2004/0041208 A1 | 3/2004 | Bhattacharyya |
| 2004/0042268 A1 | 3/2004 | Bhattacharyya |
| 2004/0052142 A1 | 3/2004 | Ikehashi et al. |

| | | | | | | |
|---|---|---|---|---|---|---|
| 2004/0108532 A1 | 6/2004 | Forbes | | EP | 1 233 454 A2 | 8/2002 |
| 2004/0238890 A1 | 12/2004 | Fazan et al. | | EP | 0 725 402 B1 | 9/2002 |
| 2004/0240306 A1 | 12/2004 | Fazan et al. | | EP | 1 237 193 | 9/2002 |
| 2005/0001269 A1 | 1/2005 | Hayashi et al. | | EP | 1 241 708 A2 | 9/2002 |
| 2005/0062088 A1 | 3/2005 | Houston | | EP | 1 253 634 A2 | 10/2002 |
| 2005/0064659 A1 | 3/2005 | Willer | | EP | 0 844 671 B1 | 11/2002 |
| 2005/0105342 A1 | 5/2005 | Tang et al. | | EP | 1 280 205 | 1/2003 |
| 2005/0111255 A1 | 5/2005 | Tang et al. | | EP | 1 288 955 | 3/2003 |
| 2005/0135169 A1 | 6/2005 | Somasekhar et al. | | FR | 2 197 494 | 3/1974 |
| 2005/0141262 A1 | 6/2005 | Yamada et al. | | GB | 1 414 228 | 11/1975 |
| 2005/0141290 A1 | 6/2005 | Tang et al. | | JP | 62-272561 | 11/1987 |
| 2005/0145886 A1 | 7/2005 | Keshavarzl et al. | | JP | 02-294076 | 2/1991 |
| 2005/0145935 A1 | 7/2005 | Keshavarzi et al. | | JP | 3-171768 | 7/1991 |
| 2005/0167751 A1 | 8/2005 | Nakajima et al. | | JP | 8-213624 | 8/1996 |
| 2005/0189576 A1 | 9/2005 | Ohsawa | | JP | 8-274277 | 10/1996 |

FOREIGN PATENT DOCUMENTS

| | | |
|---|---|---|
| EP | 0 350 057 B1 | 1/1990 |
| EP | 0 354 348 A2 | 2/1990 |
| EP | 0 202 515 B1 | 3/1991 |
| EP | 0 207 619 B1 | 8/1991 |
| EP | 0 175 378 B1 | 11/1991 |
| EP | 0 253 631 B1 | 4/1992 |
| EP | 0 513 923 | 11/1992 |
| EP | 0 300 157 B1 | 5/1993 |
| EP | 0 584 204 A2 | 10/1993 |
| EP | 0 579 566 A2 | 1/1994 |
| EP | 0 362 961 | 2/1994 |
| EP | 0 599 506 A1 | 6/1994 |
| EP | 0 359 551 B1 | 12/1994 |
| EP | 0 366 882 B1 | 5/1995 |
| EP | 0 465 961 B1 | 8/1995 |
| EP | 0 694 977 | 1/1996 |
| EP | 0 333 426 B1 | 7/1996 |
| EP | 0 727 820 A1 | 8/1996 |
| EP | 0 739 097 A2 | 10/1996 |
| EP | 0 245 515 B1 | 4/1997 |
| EP | 0 788 165 A2 | 8/1997 |
| EP | 0 801 427 | 10/1997 |
| EP | 0 510 607 B1 | 2/1998 |
| EP | 0 537 677 B1 | 8/1998 |
| EP | 0 858 109 A2 | 8/1998 |
| EP | 0 860 878 A2 | 8/1998 |
| EP | 0 869 511 A2 | 10/1998 |
| EP | 0 878 804 | 11/1998 |
| EP | 0 920 059 A2 | 6/1999 |
| EP | 0 924 766 A2 | 6/1999 |
| EP | 0 642 173 B1 | 7/1999 |
| EP | 0 727 822 B1 | 8/1999 |
| EP | 0 933 820 A1 | 8/1999 |
| EP | 0 951 072 A1 | 10/1999 |
| EP | 0 971 360 A1 | 1/2000 |
| EP | 0 980 101 A2 | 2/2000 |
| EP | 0 601 590 B1 | 4/2000 |
| EP | 0 993 037 A2 | 4/2000 |
| EP | 0 836 194 B1 | 5/2000 |
| EP | 0 599 368 B1 | 8/2000 |
| EP | 0 689 252 B1 | 8/2000 |
| EP | 0 606 758 B1 | 9/2000 |
| EP | 0 682 370 B1 | 9/2000 |
| EP | 1 073 121 A2 | 1/2001 |
| EP | 0 726 601 B1 | 9/2001 |
| EP | 0 731 972 | 11/2001 |
| EP | 1 162 663 A2 | 12/2001 |
| EP | 1 162 744 A1 | 12/2001 |
| EP | 1 160 799 | 2/2002 |
| EP | 1 179 850 A2 | 2/2002 |
| EP | 1 191 596 A2 | 3/2002 |
| EP | 1 204 146 A1 | 5/2002 |
| EP | 1 204 147 A1 | 5/2002 |
| EP | 1 209 747 A2 | 5/2002 |
| EP | 0 744 772 B1 | 8/2002 |
| JP | 9-046686 | 2/1997 |
| JP | 9-82912 | 3/1997 |
| JP | 10-242470 | 9/1998 |
| JP | 11-87649 | 3/1999 |
| JP | 2000-247735 | 8/2000 |
| JP | 2000-274221 | 9/2000 |
| JP | 2000-389106 | 12/2000 |
| JP | 2001-180633 | 6/2001 |
| JP | 2002-009081 | 1/2002 |
| JP | 2002-94027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-31693 | 1/2003 |
| JP | 2003-86712 | 3/2003 |
| JP | 2003-100641 | 4/2003 |
| JP | 2003-100900 | 4/2003 |
| JP | 2003-132682 | 5/2003 |
| JP | 2003-203987 | 7/2003 |
| JP | 2003-243528 | 8/2003 |

OTHER PUBLICATIONS

"A 312-MHz 16-Mb Random-Cycle Embedded DRAM Macro With a Power-Down Data Retention Mode for Mobile Applications", F. Morishita et al., J. Solid-State Circuits, vol. 40, No. 1, pp. 204-212, 2005.

"Leakage Mechanism due to Floating Body and Countermeasure on Dynamic Retention Mode of SOI-DRAM", F. Morishita et al., Symposium on VLSI Technology Digest of Technical Papers, pp. 141-142, 1995.

"Scalability Study on a Capacitorless IT-DRAM: From Single-gate PD-SOI to Double-gate FINDRAM", Tanaka et al., 2004 IEEE, 4 pages.

"A Design of a Capacitorless 1-T-DRAM Cell Using Gate-Induced Drain Leakage (GIDL) Current for Low-Power and High-speed Embedded Memory", Yoshida et al., 2003 IEEE, 4 pages.

"A Capacitorless Double-Gate DRAM Cell", Kuo et al., IEEE Electron Device Letters, vol. 23, No. 6, Jun. 2002, pp. 345-347.

"A Capacitorless Double-Gate DRAM Cell for High Density Applications", Kuo et al., IEEE IEDM, 2002, pp. 843-946.

"The Multi-Stable Behaviour of SOI-NMOS Transistors at Low Temperatures", Tack et al., Proc. 1988 SOS/SOI Technology Workshop (Sea Palms Resort, St. Simons Island, GA, Oct. 1988), p. 78.

"The Multistable Charge-Controlled Memory Effect in SOI MOS Transistors at Low Temperatures", Tack et al., IEEE Transactions on Electron Devices, vol. 37, No. 5, May 1990, pp. 1373-1382.

"Mechanisums of Charge Modulation In the Floating Body of Triple-Well nMOSFET Capacitor-less DRAMs", Villaret et al., Proceedings of the INFOS 2003, Insulating Films on Semiconductors, 13th Bi-annual Conference, Jun. 18-20, 2003, Barcelona (Spain), (4 pages).

"A Memory Using One-Transistor Gain Cell on SOI (FBC) with Performance Suitable for Embedded DRAMs", Ohsawa et al., 2003 Symposium on VLSI Circuits Digest of Technical Papers, Jun. 2003 (4 pages).

FBC (Floating Body Cell) for Embedded DRAM on SOI, Inoh et al., 2003 Symposium on VLSI Circuits Digest of Technical Papers, Jun. 2003 (2 pages).

"Toshiba's DRAM Cell Piggybacks on SOI Wafer", Y. Hara, EE Times, Jun. 2003.

"Memory Design Using a One-Transistor Gain Cell on SOI", Ohsawa et al., IEEE Journal of Solid-State Circuits, vol. 37, No. 11, Nov. 2002, pp. 1510-1522.

"Opposite Side Floating Gate SOI FLASH Memory Cell", Lin et al., IEEE, Mar. 2000, pp. 12-15.

"Advanced TFT SRAM Cell Technology Using a Phase-Shift Lithography", Yamanaka et al., IEEE Transactions on Electron Devices, vol. 42, No. 7, Jul. 1995, pp. 1305-1313.

"Soft-Error Characteristics in Bipolar Memory Cells with Small Critical Charge", Idei et al., IEEE Transactions on Electron Devices, vol. 38, No. 11, Nov. 1991, pp. 2465-2471.

"An SOI 4 Transistors Self-Refresh Ultra-Low-Voltage Memory Cell", Thomas et al., IEEE, Mar. 2003, pp. 401-404.

"Design of a SOI Memory Cell", Stanojevic et al., IEEE Proc. 21st International Conference on Microelectronics (MIEL '97), vol. 1, NIS, Yugoslavis, Sep. 14-17, 1997, pp. 297-300.

"Effects of Floating Body on Double Polysilicon Partially Depleted SOI Nonvolatile Memory Cell", Chan et al., IEEE Electron Device Letters, vol. 24, No. 2, Feb. 2003, pp. 75-77.

"MOSFET Design Simplifies DRAM", P. Fazan, EE Times, May 14, 2002 (3 pages).

"One of Application of SOI Memory Cell—Memory Array", Lončar et al., IEEE Proc. 22nd International Conference on Microelectronics (MIEL 2000), vol. 2, NIS, Serbia, May 14-17, 2000, pp. 455-458.

"A SOI Current Memory for Analog Signal Processing at High Temperature", Portmann et al., 1999 IEEE International SOI Conference, Oct. 1999, pp. 18-19.

"Chip Level Reliability on SOI Embedded Memory", Kim et al., Proceedings 1998 IEEE International SOI Conference, Oct. 1998, pp. 135-139.

"Analysis of Floating-Body-Induced Leakage Current in 0.15 μm SOI DRAM", Terauchi et al., Proceedings 1998 IEEE International SOI Conference, Oct. 1996, pp. 138-139.

"Programming and Erase with Floating-Body for High Density Low Voltage Flash EEPROM Fabricated on SOI Wafers", Chi et al., Proceedings 1995 IEEE International SOI Conference, Oct. 1995, pp. 129-130.

"Measurement of Transient Effects in SOI DRAM/SRAM Access Transistors", A. Wei, IEEE Electron Device Letters, vol. 17, No. 5, May 1996, pp. 193-195.

"In-Depth Analysis of Opposite Channel Based Charge Injection in SOI MOSFETs and Related Defect Creation and Annihilation", Sinha et al., Elsevier Science, Microelectronic Engineering 28, 1995, pp. 383-386.

"Dynamic Effects in SOI MOSFET's", Giffard et al., IEEE, 1991, pp. 160-161.

"A Simple 1-Transistor Capacitor-Less Memory Cell for High Performance Embedded DRAMs", Fazan et al., IEEE 2002 Custom Integrated Circuits Conference, Jun. 2002, pp. 99-102.

"A Novel Pattern Transfer Process for Bonded SOI Giga-bit DRAMs", Lee et al., Proceedings 1996 IEEE International SOI Conference, Oct. 1996, pp. 114-115.

"An Experimental 2-bit/Cell Storage DRAM for Macrocell or Memory-on-Logic Application", Furuyama et al., IEEE Journal of Solid-State Circuits, vol. 24, No. 2, Apr. 1989, pp. 388-393.

"High-Performance Embedded SOI DRAM Architiecture for the Low-Power Supply", Yamauchi et al., IEEE Journal of Solid-State Circuits, vol. 35, No. 8, Aug. 2000, pp. 1169-1178.

"An SOI-DRAM with Wide Operating Voltage Range by CMOS/SIMOX Technology", Suma et al., 1994 IEEE International Solid-State Circuits Conference, pp. 138-139.

"A Capacitorless DRAM Cell on SOI Substrate", Wann et al., IEEE IEDM, 1993, pp. 635-638.

"The Multistable Charge Controlled Memory Effect in SOI Transistors at Low Temperatures", Tack et al., IEEE Workshop on Low Temperature Electronics, Aug. 7-8, 1989, University of Vermont, Burlington, pp. 137-141.

"High-Endurance Ultra-Thin Tunnel Oxide in MONOS Device Structure for Dynamic Memory Application", Wann et al., IEEE Electron Device Letters, vol. 16, No. 11, Nov. 1995, pp. 491-493.

"Hot-Carrier Effects in Thin-Film Fully Depleted SOI MOSFET's", Ma et al., IEEE Electron Device Letters, vol. 15, No. 6, Jun. 1994, pp. 218-220.

"Design Analysis of Thin-Body Silicide Source/Drain Devices", 2001 IEEE International SOI Conference, Oct. 2001, pp. 21-22.

"SOI MOSFET on Low Cost SPIMOX Substrate", Iyer et al., IEEE IEDM, Sep. 1998, pp. 1001-1004.

"Simulation of Floating Body Effect in SOI Circuits Using BSIM3SOI", Tu et al., Proceedings of Technical Papers (IEEE Cat No. 97th8303), pp. 339-342.

"High-Field Transport of Inversion-Layer Electrons and Holes including Velocity Overshoot", Assaderaghi et al., IEEE Transactions on Electron Devices, vol. 44, No. 4, Apr. 1997, pp. 664-671.

"Dynamic Threshold-Voltage MOSFET (DTMOS) for Ultra-Low Voltage VLSI", Assaderaglti et al., IEEE Transactions on Electron Devices, vol. 44, No. 3, Mar. 1997, pp. 414-422.

"Hot-Carrier-Induced Degradation in Ultra-Thin-Film Fully-Depleted SOI MOSFETs", Yu et al., Solid-State Electronics, vol. 39, No. 12, 1996, pp. 1791-1794.

Hot-Carrier Effect in Ultra-Thin-Film (UTF) Fully-Depleted SOI MOSFET's, Yu et al., 54th Annual Device Research Conference Digest (Cat. No. 98th8193), pp. 22-23.

"SOI MOSFET Design for All-Dimensional Scaling with Short Channel, Narrow Width and Ultra-thin Films", Chan et al., IEEE IEDM, 1995, pp. 631-634.

"A Novel Silicon-On-Insulator (SOI) MOSFET for Ultra Low Voltage Operation", Assaderaghi et al., 1994 IEEE Symposium on Low Power Electronics, pp. 58-59.

"Interface Characterization of Fully-Depleted SOI MOSFET by a Subthreshold I-V Method", Yu et al., Proceedings 1994 IEEE International SOI Conference, Oct. 1994, pp. 63-64.

"A Capacitorless Double-Gate DRAM Cell Design for High Density Applications", Kuo et al., IEEE IEDM, Feb. 2002, pp. 843-846.

"A Dynamic Threshold Voltage MOSFET (DTMOS) for Ultra-Low Voltage Operation", Assaderaghi et al., IEEE Electron Device Letters, vol. 15, No. 12, Dec. 1994, pp. 510-512.

"Dynamic Threshold-Voltage MOSFET (DTMOS) for Ultra-Low Voltage Operation", Assaderaghi et al., 1994 EEE, IEDM 94, pp. 809-812.

"A Capacitorless DRAM Cell on SOI Substrate", Wann et al., IEEE IEDM 1993, pp. 635-638.

"Studying the Impact of Gate Tunneling on Dynamic Behaviors of Partially-Depleted SOI CMOS Using BSIMPD", Su et al., IEEE Proceedings of the International Symposium on Quality Electronic Design (ISQED '02), Apr. 2002 (5 pages).

"Characterization of Front and Back SI-$SiO_2$ Interfaces in Thick- and Thin-Film Silicon-on-Insulator MOS Structures by the Charge-Pumping Technique", Wouters et al., IEEE Transactions on Electron Devices, vol. 36, No. 9, Sep. 1989, pp. 1746-1750.

"An Analytical Model for the Misis Structure in SOI MOS Devices", Tack et al., Solid-State Electronics vol. 33, No. 3, 1990, pp. 357-364.

"A Long Data Retention SOI DRAM with the Body Refresh Function", Tomishima et al., IEICE Trans. Electron., vol. E80-C, No. 7, Jul. 1997, pp. 899-904.

"Capacitor-Less 1-Transistor DRAM", Fazan et al., 2002 IEEE International SOI Conference, Oct. 2002, pp. 10-13.

"SOI (Silicon-on-Insulator) for High Speed Ultra Large Scale Integration", C. Hu, Jpn. J. Appl. Phys, vol. 33 (1994) pp. 365-369, Part 1, No. 18, Jan. 1994.

"Source-Bias Dependent Charge Accumulation in P+ -Poly Gate SOI Dynamic Random Access Memory Cell Transistors", Sim et al., Jpn. J. Appl. Phys. vol. 37 (1998) pp. 1260-1263, Part 1, No. 38, Mar. 1998.

"Suppression of Parasitic Bipolar Action in Ultra-Thin-Film Fully-Depleted CMOS/SIMOX Devices by Ar-ion Implantation into Source/Drain Regions", Ohno et al., IEEE Transactions on Electron Devices, vol. 45, No. 5, May 1998, pp. 1071-1076.

Fully Isolated Lateral Bipolar-MOS Transistors Fabricated In Zone-Melting-Recrystallized SI Films on SiO$_2$, Tsaur et al., IEEE Electron Device Letters, vol. EDL-4, No. 8, Aug. 1983, pp. 269-271.

"Silicon-On-Insulator Bipolar Transistors", Rodder et al., IEEE Electron Device Letters, vol. EDL-4, No. 6, Jun. 1983, pp. 193-195.

"Characteristics and Three-Dimensional Integration of MOSFET's in Small-Grain LPCVD Polycrystalline Silicon", Malhi et al., IEEE Transactions on Electron Devices, vol. ED-32; No. 2, Feb. 1985, pp. 258-281.

"Triple-Wel nMOSFET Evaluated as a Capacitor-Less DRAM Cell for Nanoscale Low-Cost & High Density Applications", Viliaret et al., Handout at Proceedings of 2003 Silicon Nanoelectronics Workshop, Jun. 8-9, 2003, Kyoto, Japan (2 pages).

"Mechanisms of Charge Modulation in the Floating Body of Triple-Well NMOSFET Capacitor-less DRAMs", Viliaret et al., Handout at Proceedings of INFOS 2003, Jun. 18-20, 2003, Barcelona, Spain (2 pages).

"Embedded DRAM Process Technology", M. Yamawaki, Proceedings of the Symposium on Semiconductors and Integrated Circuits Technology, 1998, vol. 55, pp. 38-43.

"3-Dimensional Simulation of Turn-off Current in Partially Depleted SOI MOSFETs", Ikeda et al., IEIC Technical Report, Institute of Electronics, Information and Communication Engineers, 1998, vol. 97, No. 557 (SDM97 186-198), pp. 27-34.

"DRAM Design Using the Taper-Isolated Dynamic RAM Cell, Leiss et al.", IEEE Transactions on Electron Devices, vol. ED-29, No. 4, Apr. 1982, pp. 707-714.

\* cited by examiner

| Volts | Write0 | Write1 | Read | Hold |
|---|---|---|---|---|
| WL (gate) | 2.9 | 0.6 | 0.6 | 0.0 |
| BL (Drain) | 2.3 | 2.3 | 0.3 | 0.0 |
| SL (source) | 0.0 | 0.0 | 0.0 | 0.0 |

FIGURE 4

| Volts | Write0 | Write1 | Read | Hold |
|---|---|---|---|---|
| WL (gate) | 0 | -1.7 | 0.0 | -0.5 |
| BL (Drain) | 1.7 | 1.7 | 0.0 | 0.0 |
| SL (source) | 0.0 | 0.0 | -0.5 | 0.0 |

FIGURE 5

| Volts | Write0 | Write1 | Read | Hold |
|---|---|---|---|---|
| WL (gate) | 1.8 | 0.6 | 0.6 | -0.5 |
| BL (Drain) | 1.8 | 1.8 | 0.3 | 0.0 |
| SL (source) | 0.0 | 0.0 | 0.0 | 0.0 |

FIGURE 6

| Volts | Unselected WL | Selected WL (write0) | Unselected WL |
|---|---|---|---|
| Unselected BL | WL:0v, BL:0v | WL:1.8v, BL:0v | WL:0v, BL:0v |
| Selected BL | WL:0v, BL:1.8v | WL:1.8v, BL:1.8v | WL:0v, BL:1.8v |
| Unselected BL | WL:0v, BL:0v | WL:1.8v, BL:0v | WL:0v, BL:0v |

FIGURE 7

SEMICONDUCTOR MEMORY DEVICE AND METHOD OF OPERATING SAME

CROSS-REFERENCE TO RELATED APPLICATIONS

This application is a divisional of application Ser. No. 10/840,009, filed May 6, 2004 now abandoned, which claims priority to: (1) U.S. Provisional Application Ser. No. 60/470,384, entitled "Method of Operating Semiconductor Memory Device", filed May 13, 2003; and (2) U.S. Provisional Application Ser. No. 60/470,318, entitled "Dual Port One Transistor DRAM Memory Cell and Extension to Multi-Port Memory Cell", filed May 13, 2003 (hereinafter collectively "the Provisional Applications"). The contents of the Provisional Applications are incorporated by reference herein in their entirety.

BACKGROUND

This invention relates to a semiconductor dynamic random access memory ("DRAM") cell, array and/or device and method of controlling and/or operating a semiconductor memory cell array and/or device; and more particularly, in one aspect, to a semiconductor dynamic random access memory ("DRAM") cell, array and/or device wherein the memory cell includes an electrically floating body in which an electrical charge is stored.

There are many different types and/or forms of DRAM cells, including, for example, a semiconductor memory cell consisting of an access transistor and a capacitor, which stores an electric charge representing a bi-stable memory state. The access transistor serves as a switch for controlling the charging and discharging of the capacitor as well as reading and writing of the logic states into the capacitor (i.e., charging or discharging the capacitor).

Although significant integration densities can be achieved with DRAM devices employing one transistor—one capacitor memory cells, such devices tend to be limited or restricted with respect to the size of the memory cell. In this regard, conventional techniques employ stacked and/or trench capacitor approaches, whereby the capacitor is partially disposed above and/or below an access transistor.

In addition, DRAM devices employing one transistor—one capacitor memory cells tend to be fabricated using manufacturing processes that are different from and/or incompatible with manufacturing processes for logic devices (for example, microprocessors). As a result, integration of one transistor—one capacitor memory cells into logic devices is often complicated and expensive.

Another type of dynamic random access memory cell is described and illustrated in non-provisional patent application entitled "Semiconductor Device", which was filed on Jun. 10, 2003, and assigned Ser. No. 10/450,238 (hereinafter "Semiconductor Memory Device Patent Application"). With reference to FIGS. 1A and 1B, the Semiconductor Memory Device Patent Application discloses, among other things, semiconductor DRAM device 10 in which each memory cell 12 consists of transistor 14 having gate 16, body region 18, which is electrically floating, source region 20 and drain region 22. The body region 18 is disposed between and adjacent to source region 20 and drain region 22. Data is written into or read from a selected memory cell by applying suitable control signals to a selected word line(s) 24, a selected source line(s) 26 and/or a selected bit line(s) 28. In response, charge carriers are accumulated in or emitted and/or ejected from electrically floating body region 18 wherein the data states are defined by the amount of carriers within electrically floating body region 18.

In particular, in one embodiment, the memory cell of the Semiconductor Memory Device Patent Application operates by accumulating in or emitting/ejecting majority carriers (electrons or holes) 30 from body region 18 of N-channel transistors. (See, FIGS. 2A and 2B). In this regard, accumulating majority carriers (in this example, "holes") 30 in body region 18 of memory cells 12 via, for example, impact ionization near source region 20 and/or drain region 22, is representative of a logic high or "1" data state. (See, FIG. 2A). Emitting or ejecting majority carriers 30 from body region 18 via, for example, forward biasing the source/body junction and/or the drain/body junction, is representative of a logic low or "0". (See, FIG. 2B).

Various techniques may be employed to read the data stored in (or write the data into) a memory device of the Semiconductor Memory Device Patent Application. For example, a current sense amplifier (not illustrated) may be employed to read the data stored in memory cells 12. In this regard, a current sense amplifier may compare the memory cell current to a reference current, for example, the current of a reference cell (not illustrated). From that comparison, it may be determined whether memory cell 12 contained a logic high (relatively more majority carriers 30 contained within body region 18) or logic low data state (relatively less majority carriers 28 contained within body region 18).

Notably, transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable.

The transistor 14 may be controlled using a negative drain voltage on, for example, bit line 28$i$, to remove holes from electrically floating body region 18 through drain 22 to write a logic low (i.e., binary state "0"). Under this circumstances, a negative voltage applied to gate 16 of the other (non-selected) memory cells in the memory array of device 10 may be necessary to avoid "leakage current" in other cells connected to the same bit line 28$i$ when the negative bit line voltage is applied during the write (logic low) operation.

Other operations such as writing a logic high data state (binary "1") and reading the data may be performed using positive voltages applied to word lines 24. As such, transistors 14 of device 10 are periodically pulsed between a positive gate bias, which (1) drives majority carriers (holes for N-channel transistors) away from the interface between gate insulator 32 and body region 18 of transistor 14 and (2) causes minority carriers (electrons for N-channel transistors) to flow from source region 20 and drain region 22 into a channel formed below gate 16, and a negative gate bias, which causes majority carriers (holes for N-channel transistors) to accumulate in or near the interface between gate 16 and body region 18 of transistor 14.

With reference to FIG. 3A, a positive voltage applied to gate 16 provides a positive gate bias which causes (1) a channel of minority carriers 34 to form beneath gate 16 and (2) accumulation of majority carriers 30 in body region 18 in an area "opposite" the interface of gate 16 and body region 18. Here, minority carriers (i.e., electrons in an N-channel transistor) may flow in the channel beneath the interface of gate oxide 32 and floating body region 18 wherein some of the minority carriers 34 are "trapped" by or in defects within the semiconductor (typically created or caused by the transition from one material type to another).

With reference to FIG. 3B, when a negative voltage is applied to gate 16, the gate bias is negative which substantially eliminates the channel of minority carriers 34 beneath gate 16 (and gate oxide 34). However, some of minority carriers may remain "trapped" in the interface defects (illustrated generally by electrons 36).

Some of the trapped electrons 36 recombine with majority carriers which are attracted to gate 16 (due to the negative gate bias), and, as such, the net charge of majority carriers 30 located in floating body region 18 may decrease over time (see, for example, FIG. 3C). This phenomenon may be characterized as charge pumping. Thus, pulsing between positive and negative gate biases (during read and write operations) may reduce the net quantity of charge in memory cell 12, which, in turn, may gradually eliminate the data stored in memory cell 12.

Notably, for the efficient charge pumping phenomenon to occur, the free electron concentration at the surface ($n_e$) in inversion should be sufficiently large that the interface traps can capture electrons during the time the transistor is in inversion. The time constant for electron capture may be characterized as:

$$\tau_e = \frac{1}{v_{th} \cdot \sigma_n \cdot n_e}$$

Accordingly, in the case $\tau_e$=3 ns (typical pulse duration in advanced DRAM memories), the thermal velocity $V_{th}$=1×$10^7$ cm/s and the capture cross section $\sigma_n$=2×$10^{-16}$ cm$^2$, at least $n_e \approx 2 \times 10^{17}$ cm$^{-3}$ may be required. Analogously, in accumula the free hole concentration at the surface ($n_h$) should be sufficiently large that holes can recombine with the captured electrons during the time transistor 14 is in accumulation. If $\sigma_n = \sigma_p$, $n_h \approx 2 \times 10^{17}$ cm$^{-3}$ at least may be required (i.e., the efficient charge pumping effect exists if the gate voltage in inversion accumulates at least 2×$10^{17}$ cm$^{-3}$ electrons at the surface and the gate voltage in accumulation accumulates at least 2×$10^{17}$ cm$^{-3}$ holes).

Notably, the entire contents of the Semiconductor Memory Device Patent Application, including, for example, the features, attributes, architectures, configurations, materials, techniques and advantages described and illustrated therein, are incorporated by reference herein.

SUMMARY OF THE INVENTION

There are many inventions described and illustrated herein. In a first principal aspect, the present invention is a semiconductor memory array comprising a plurality of semiconductor dynamic random access memory cells arranged in a matrix of rows and columns. Each semiconductor dynamic random access memory cell includes a transistor having a source region, a drain region, a electrically floating body region disposed between and adjacent to the source region and the drain region, and a gate spaced apart from, and capacitively coupled to, the body region. Each transistor includes a first state representative of a first charge in the body region, and a second data state representative of a second charge in the body region. Further, each row of semiconductor dynamic random access memory cells includes an associated source line which is connected to only the semiconductor dynamic random access memory cells of the associated row.

In one embodiment of this aspect of the present invention, each memory cell of each row of semiconductor dynamic random access memory cells includes a separate bit line which is connected to the drain region of the associated transistor. In operation, each memory cell of a first row is programmed to a first data state by applying a control signal, having a first amplitude, to the gate of the transistor of each memory cell of the first row and a control signal, having a second amplitude, to the drain of each memory cell of the first row. Thereafter, a predetermined memory cell of the first row may be programmed to a second data state by applying a control signal, having a third amplitude, to the gate of the transistor of the predetermined memory cell, a control signal, having an fourth amplitude, to the drain of predetermined memory cell, and a control signal, having a fifth amplitude, to the source of predetermined memory cell of the row. Notably, unselected memory cell(s) of the first row is/are maintained in the first data state, while the predetermined memory cell is programmed to a second data state, by applying a control signal, having a third amplitude, to the gate of the transistor of the predetermined memory cell and a control signal, having an sixth amplitude, to the drain of predetermined memory cell.

The memory cells of the first row may be read by applying a control signal, having a seventh amplitude, to the gate of the transistor of the predetermined memory cell and a control signal, having an eighth amplitude, to the drain of predetermined memory cell. Notably, all of the memory cells of a second row (an unselected row) are maintained in an inhibit state while the memory cells of the first row are read. In one embodiment, the memory cells of the second row are maintained in an inhibit state (while the memory cells of the first row are read) by applying a control signal having a ninth amplitude to the gate of the transistors of the memory cells of the second row.

In one embodiment, the each memory cell of a first row of semiconductor dynamic random access memory cells shares a drain region with a memory cell in a second row of semiconductor dynamic random access memory cells, wherein the first and second rows of memory cells are adjacent rows. In another embodiment, each gate of each memory cell of a first row of semiconductor dynamic random access memory cells is connected to a first gate line. In yet another embodiment, the gate of each memory cell of the first row of semiconductor dynamic random access memory cells is connected to the first gate line.

In another principal aspect, the present invention is a semiconductor memory array comprising a plurality of semiconductor dynamic random access memory cells arranged in a matrix of rows and columns. Again, each semiconductor dynamic random access memory cell includes a transistor having a source region, a drain region, a electrically floating body region disposed between and adjacent to the source region and the drain region, and a gate spaced apart from, and capacitively coupled to, the body region. Each transistor includes a first state representative of a first charge in the body region, and a second data state representative of a second charge in the body region.

In this aspect, the each row of semiconductor dynamic random access memory cells includes (1) an associated source line which is connected to only the semiconductor dynamic random access memory cells in the associated row and (2) a different gate line for each semiconductor dynamic random access memory cells in the associated row.

In one embodiment of this aspect of the present invention, each memory cell of each row of semiconductor dynamic random access memory cells includes a separate bit line which is connected to the drain region of the associated transistor. In operation, each memory cell of a first row is programmed to a first data state by applying a control signal, having a first amplitude, to the gate of the transistor of each memory cell of the first row and a control signal, having a second amplitude, to the drain of each memory cell of the first row. Thereafter, a predetermined memory cell of the first row may be programmed to a second data state by applying a control signal, having a third amplitude, to the gate of the transistor of the predetermined memory cell, a control signal, having a fourth amplitude, to the drain of predetermined memory cell, and a control signal, having a fifth amplitude, to the source of predetermined memory cell of the row. Notably, unselected memory cell(s) of the first row is/are maintained in the first data state, while the predetermined memory cell is programmed to a second data state, by applying a control signal, having a third amplitude, to the gate of the transistor of the predetermined memory cell and a control signal, having a sixth amplitude, to the drain of predetermined memory cell.

The memory cells of the first row may be read by applying a control signal, having a seventh amplitude, to the gate of the transistor of the predetermined memory cell and a control signal, having an eighth amplitude, to the drain of predetermined memory cell. Notably, all of the memory cells of a second row (an unselected row) are maintained in an inhibit state while the memory cells of the first row are read. In one embodiment, the memory cells of the second row are maintained in an inhibit state (while the memory cells of the first row are read) by applying a control signal having a ninth amplitude to the gate of the transistors of the memory cells of the second row.

In one embodiment, the each memory cell of a first row of semiconductor dynamic random access memory cells shares a drain region with a memory cell in a second row of semiconductor dynamic random access memory cells, wherein the first and second rows of memory cells are adjacent rows. In another embodiment, each gate of each memory cell of a first row of semiconductor dynamic random access memory cells is connected to a first gate line.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 4 is a tabulation of exemplary voltage pulse levels that may be employed in a method of a first embodiment of the present invention;

FIG. 5 is a tabulation of exemplary voltage pulse levels that may be employed in a method of a second embodiment of the present invention;

FIG. 6 is a tabulation of exemplary voltage pulse levels that may be employed in a method of a third embodiment of the present invention;

FIG. 7 is a tabulation of exemplary voltage pulse levels that may be employed in a method of an embodiment of the present invention;

DETAILED DESCRIPTION

There are many inventions described and illustrated herein. In a first aspect, the present invention is directed to a memory device and technique of reading data from and writing data into memory cells of the memory device. In this regard, in one embodiment of this aspect of the invention, the memory device and technique for operating that device that minimizes, reduces and/or eliminates the debilitating affects of the charge pumping phenomenon. This embodiment of the present invention employs control signals that minimize, reduce and/or eliminate transitions of the amplitudes and/or polarities.

Figure 1A:
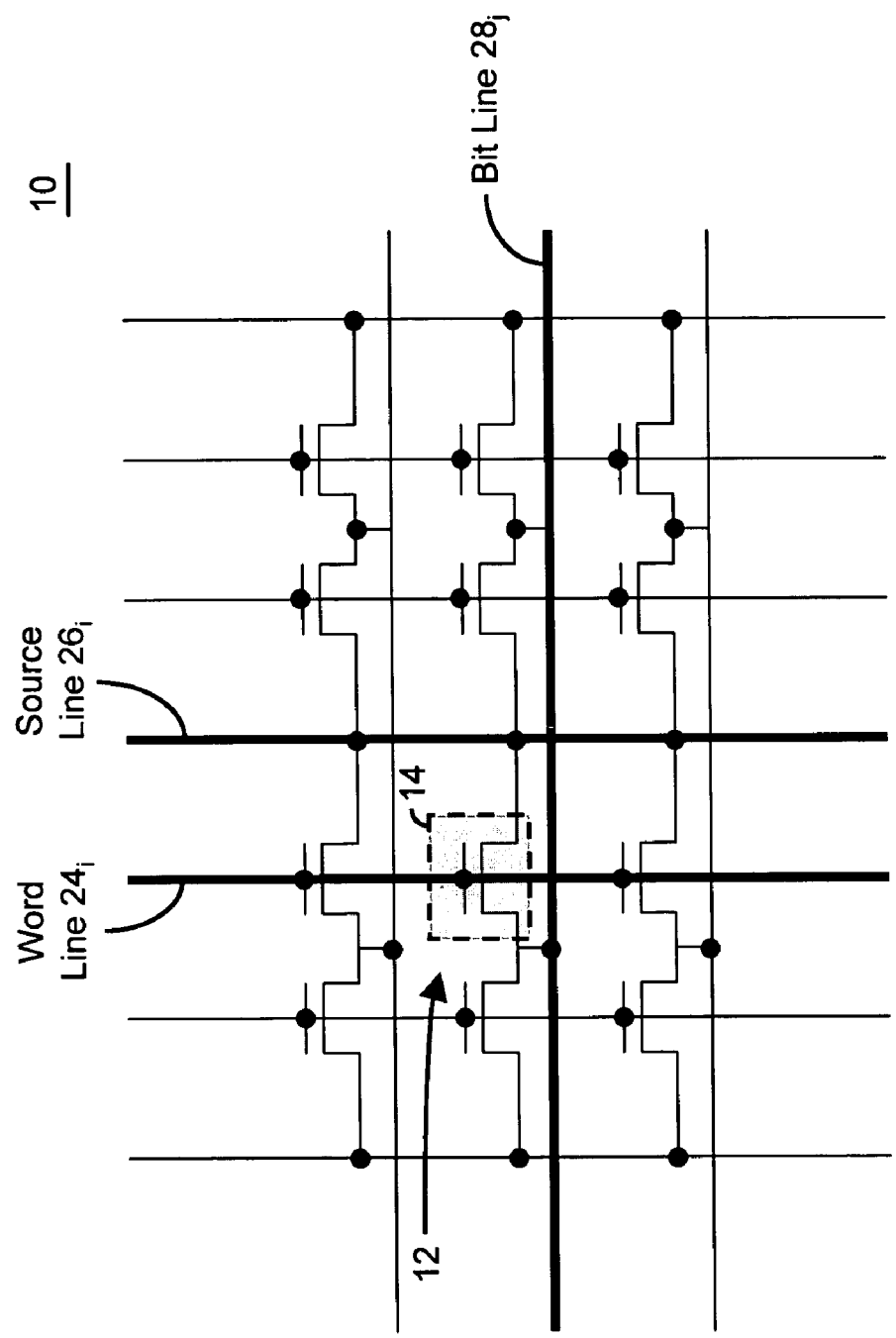
FIG. 1A is a schematic representation of a semiconductor DRAM array as illustrated (and described) in the Semiconductor Memory Device Patent Application.
Figure 1B:
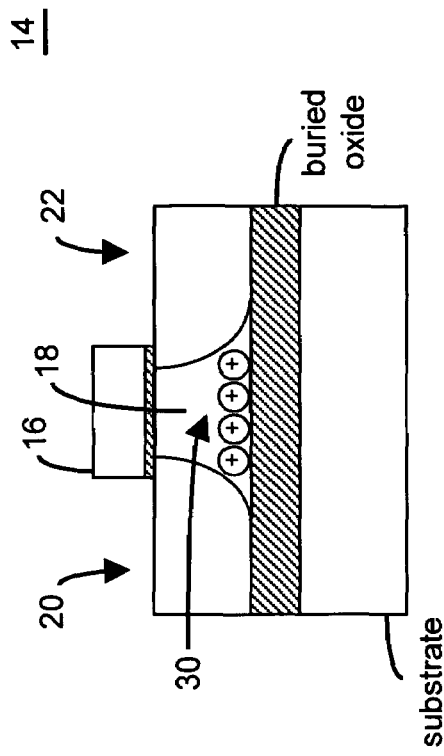
FIG. 1B illustrates a memory cell according to the Semiconductor Memory Device Patent Application.
Figure 2B:
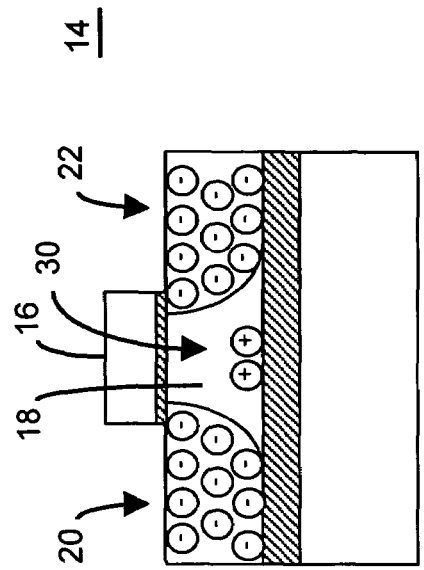
FIGS. 2A and 2B are exemplary schematic illustrations of the charge relationship, for a particular memory state, of the floating body, source and drain regions of a memory cell according to the Semiconductor Memory Device Patent Application.
Figure 2A:
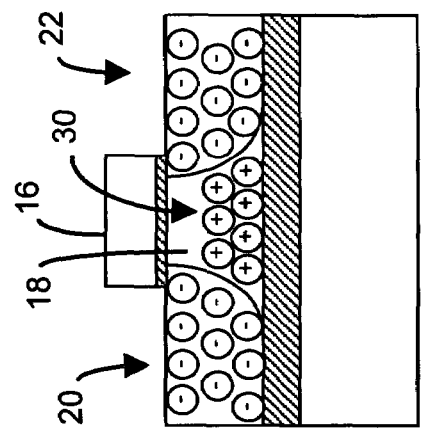
Figure 3A:
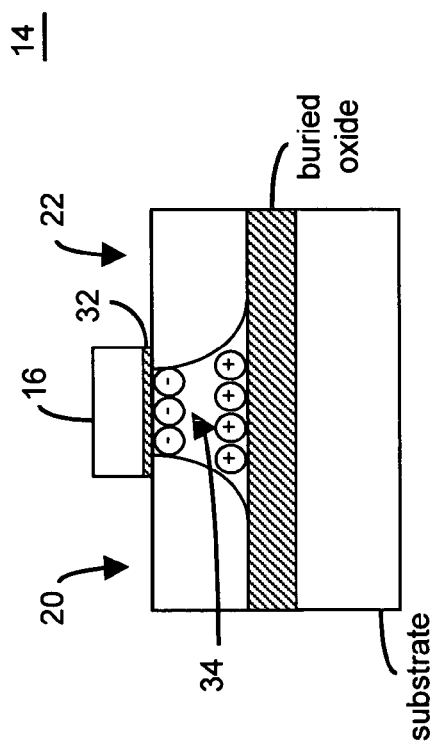
FIGS. 3A–3C are exemplary schematic and general illustrations of the charge relationship and charge pumping phenomenon caused by pulsing between positive and negative gate biases (during read and write operations) of the memory cell of FIG. 1B.
Figure 3C:
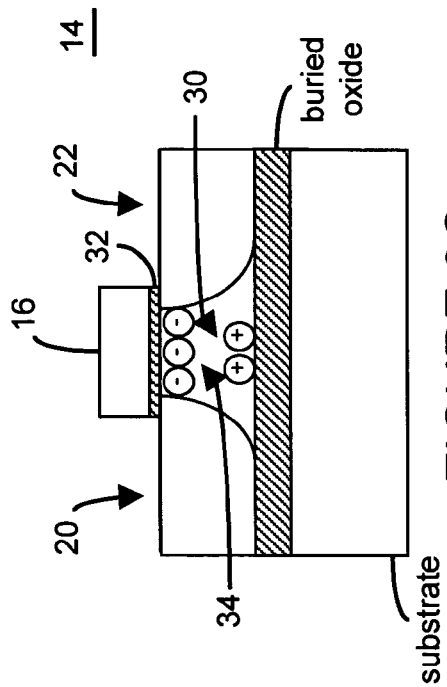
Figure 3B:
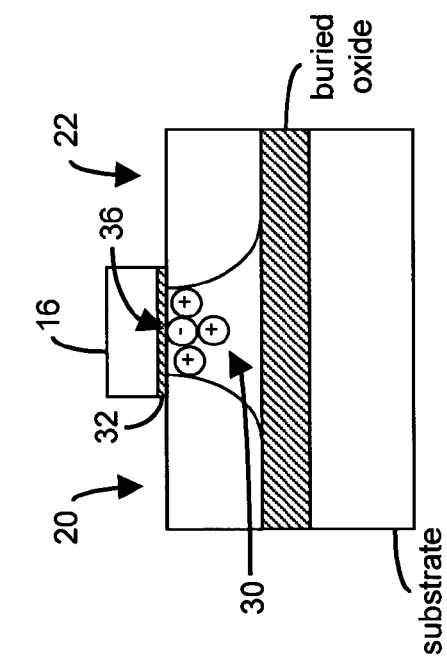

With reference to FIGS. 1 and 4, in one embodiment, transistor 14 (a 0.25 micron N-channel MOSFET DRAM cell) may be operated using the exemplary voltage values. In this regard, a write logic low (binary data state "0") operation, in one exemplary embodiment, may be written by applying a word line (i.e., gate bias) voltage of 2.9V, and the bit line (here, a drain bias) voltage of 2.3V. In this operation, the source line voltage is maintained at 0V. Under these conditions, the junction between body region 18 and source region 20 is forward biased, and excess holes are removed from body region 18 into source region 20.

To perform a write logic high (binary data state "1") in transistor 14, a voltage of 0.6V is applied to gate 16 (i.e., the gate bias is held at 0.6V) and a voltage of 2.3V is applied to drain 22. In response, an electric current between source region 20 and drain region 22 providing impact ionization in body region 18, which in turn generates excess majority carriers (holes) in body region 18. Note that the gate voltage of unselected cells (holding voltage) is kept at 0V. It is found that these exemplary voltages avoid strong accumulation of holes at the interface of gate oxide 32 and floating body region 18 wherein minority carriers 34 have a tendency to be "trapped" by or in defects within the semiconductor. In this way, disturbance of data caused by charge pumping is suppressed, reduced, minimized and/or eliminated.

In a second embodiment, with reference to FIGS. 1 and 5, transistor 14 (a 0.25 micron N-channel MOSFET DRAM cell) may be operated using the exemplary voltage values indicated. In this regard, to write a logic high (binary data state "1"), a strong accumulation of majority carriers at the interface of gate oxide 32 and floating body region 18 is required. In one exemplary embodiment, a voltage of −1.7V is applied to gate 16 and a voltage of 1.7V is applied to drain region 22 to provide the strong accumulation of majority carrier at the interface of gate oxide 32 and floating body region 18. These control signals cause deformation of the valence and conduction bands at the interface between body region 18 and source region 20. As a result, minority carriers (here, electrons) are injected into the conduction band by means of a tunnel effect (an effect known as gate induced drain leakage (GIDL)), which in turn causes the generation of majority carriers (here, holes) in body region 18. This operating technique has an advantage in that hole generation occurs in a non-conducting state of transistor 14. In this way, majority carrier generation may be achieved at a relatively lower power consumption.

To perform a read data operation, in one embodiment, an inversion channel is created at the interface of gate oxide 32 and floating body region 18. This may be achieved by applying a voltage of 0V to gate 16 and drain region 22 (i.e., a gate bias of 0V) and a voltage of −0.5V to source region 20.

In a third embodiment, with reference to FIGS. 1 and 6, transistor 14 (a 0.13 micron technology DRAM cell) may be programmed and/or operated using the exemplary voltages indicated. The voltages set forth in FIG. 6 represent "ideal" conditions, in which the application of the voltage pulses does not disturb the data stored within the cell. However, the cells are arranged in matrices in which some cells are accessed when others remain un-accessed, and column and row decoding are therefore necessary to enable the matrices to function. This results in voltage levels differing from the levels being applied during write, read and hold operations (in practice, all of the cells that share either the same column or row with the addressed memory cell), as a consequence of which disturbance of the data stored within those cells may occur.

An example of this is shown in FIGS. 1 and 7, in which data state "0" is being written to memory cell 12 at the intersection of the selected word line and bit line. Since all cells in the same column of FIG. 1 share the same gate voltage and all cells in the same row as FIG. 7 share the same drain voltage, voltages different from the "ideal" holding voltages are applied to those memory cells, as a result of which charge may leak from the floating body regions of those cells.

Similar arrangements occur when writing logic high (i.e., data state "1") or reading the data from memory cells 12. It is found (experimentally) that a worst case is represented by writing logic low (i.e., data state "0"), and memory cells 14 may sustain a few hundred cycles of word line switching, and over 10,000 cycles of bit line switching. It can therefore be seen that fluctuations in the gate voltage may impose limitations on the architecture of the circuit, and in particular, if it is assumed that only 100 cycles of word line pulsing are permissible, this small number of cycles could either necessitate partitioning the rows to smaller length (e.g., 64) or refreshing all cells along the word line as frequently as on a prior art DRAM involving transistors and capacitors.

Both of these arrangements are extremely inefficient since they could significantly increase the number of word line drivers or sense amplifiers required to operate the circuit. Furthermore, because each data cell is smaller (4F2) than a conventional DRAM cell (8F2), the circuit layout may be either impossible or extremely expensive to achieve.

Figure 8:
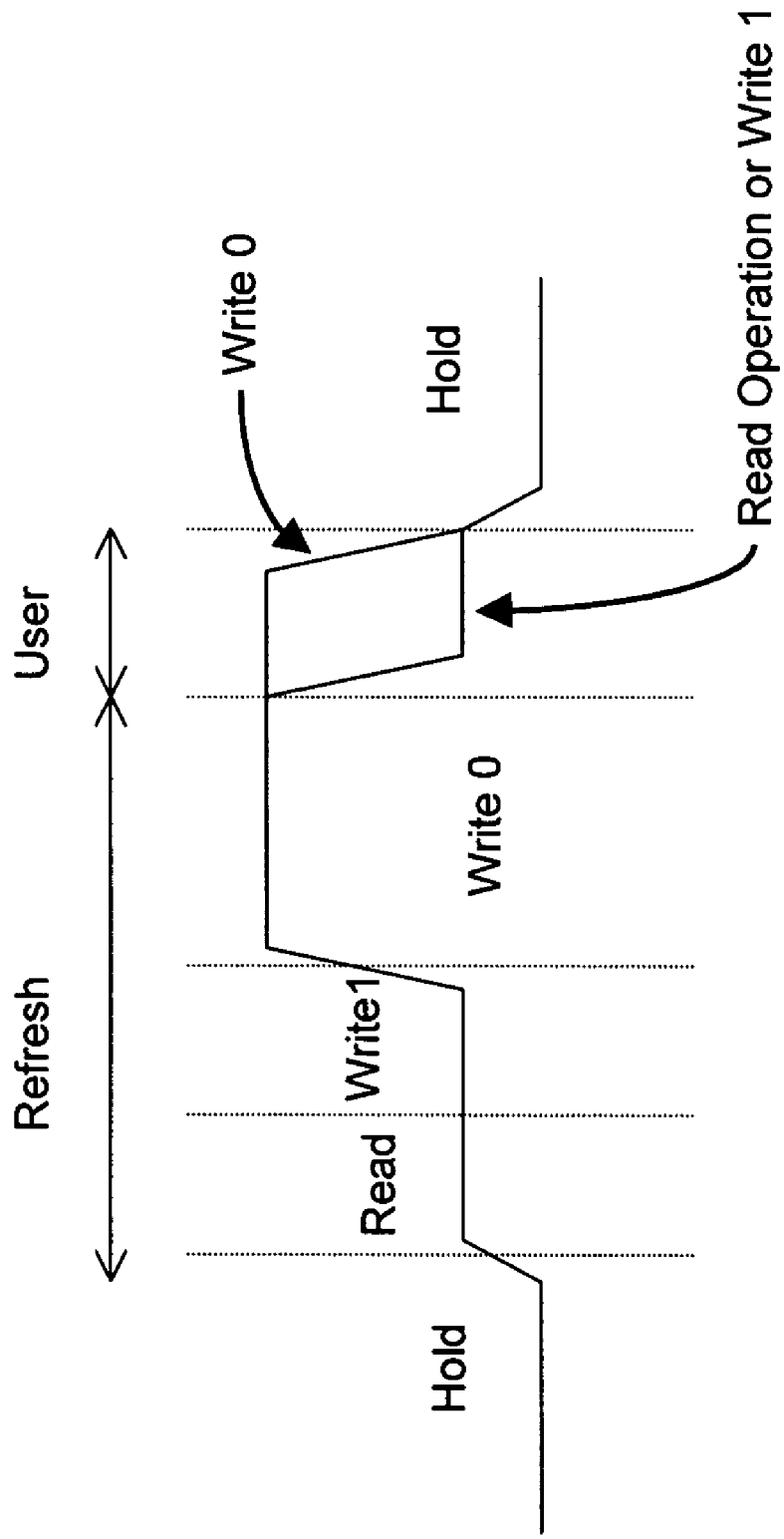
FIG. 8 illustrates an exemplary word (gate) line voltage waveform to be used in a method of a fourth embodiment of the present invention.
Figure 11:
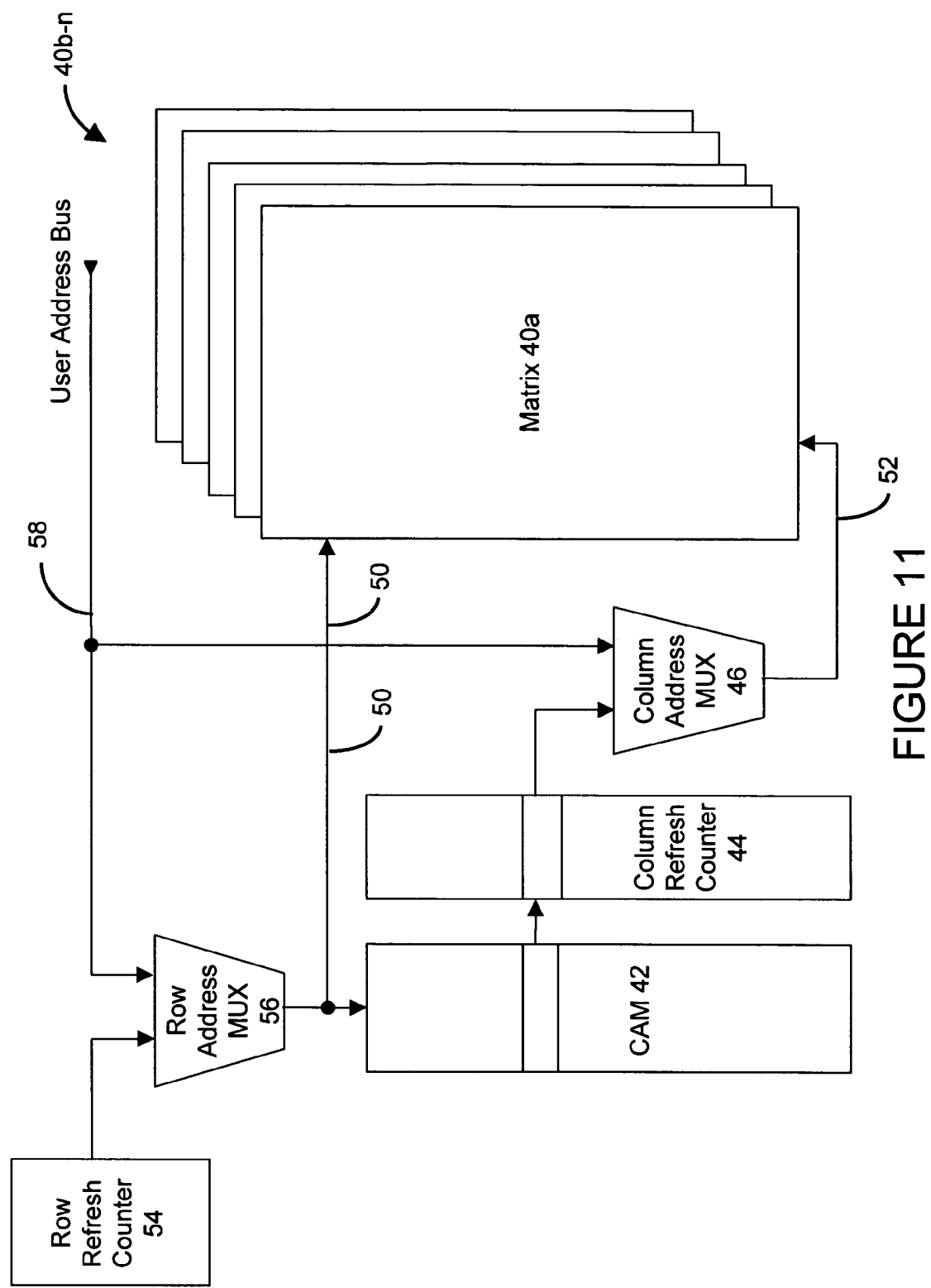
FIG. 11 is a schematic representation of semiconductor DRAM memory device according to an aspect of present invention.
Figure 12:
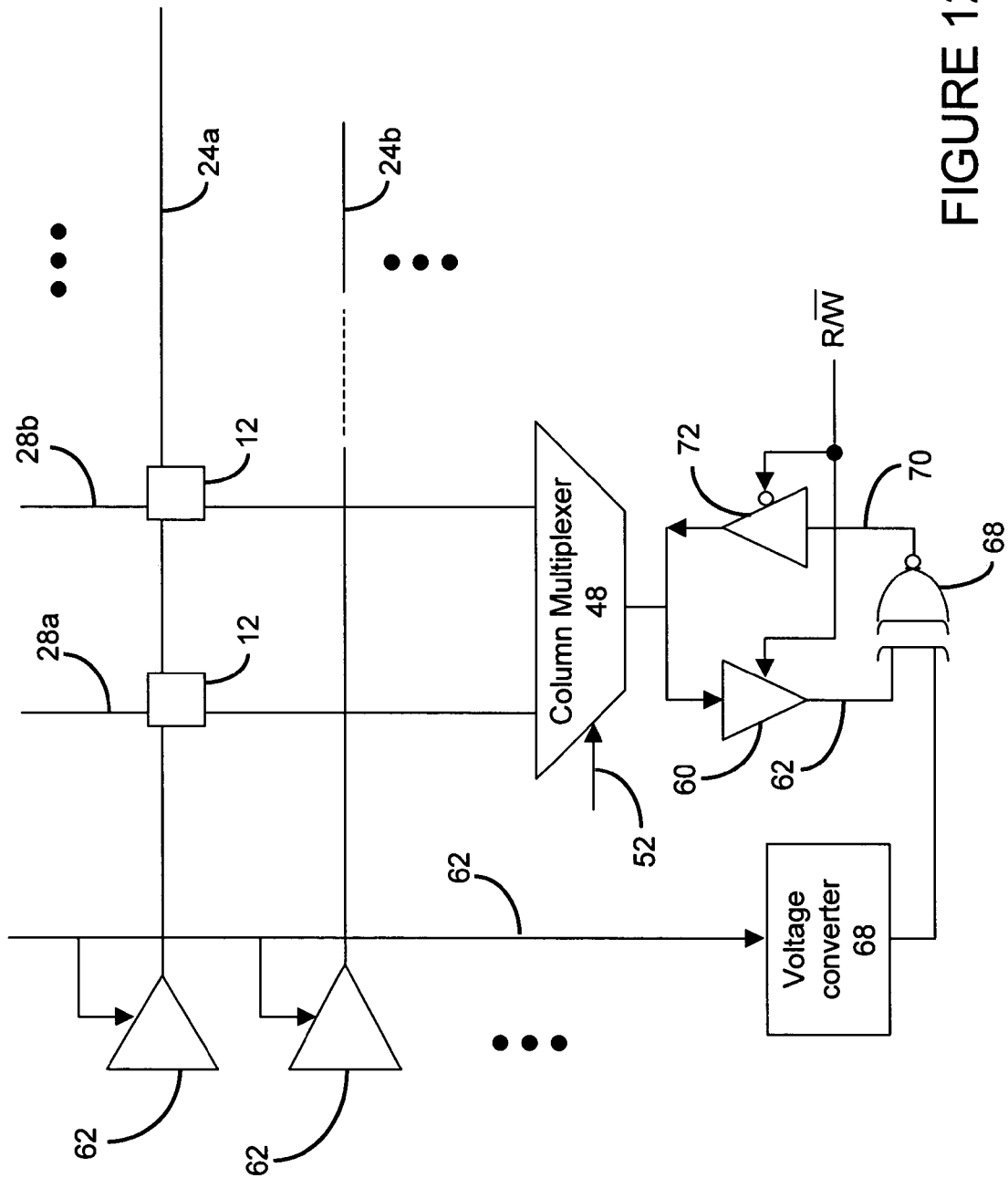
FIG. 12 is a schematic representation of column sense and refresh circuitry that may be employed in the semiconductor DRAM memory device of FIG. 11.

With reference to FIGS. 8, 11 and 12, in one embodiment, the number of word line drivers and/or sense amplifiers are reduced and/or minimized. In this regard, a column decoder is disposed or arranged between the bit lines and the sense amplifiers to reduce and/or minimize the number of sense amplifiers and, in conjunction, while only one cell in a block (typically 8 or 16) is read. The memory cell on a column defined by an internal counter (for example, among 8 or 16) and on a row defined by user addresses is read and thereafter, refreshed. That cell then is available for user access (via read or write operation) at the same row and column defined by the user addresses.

Figure 9:
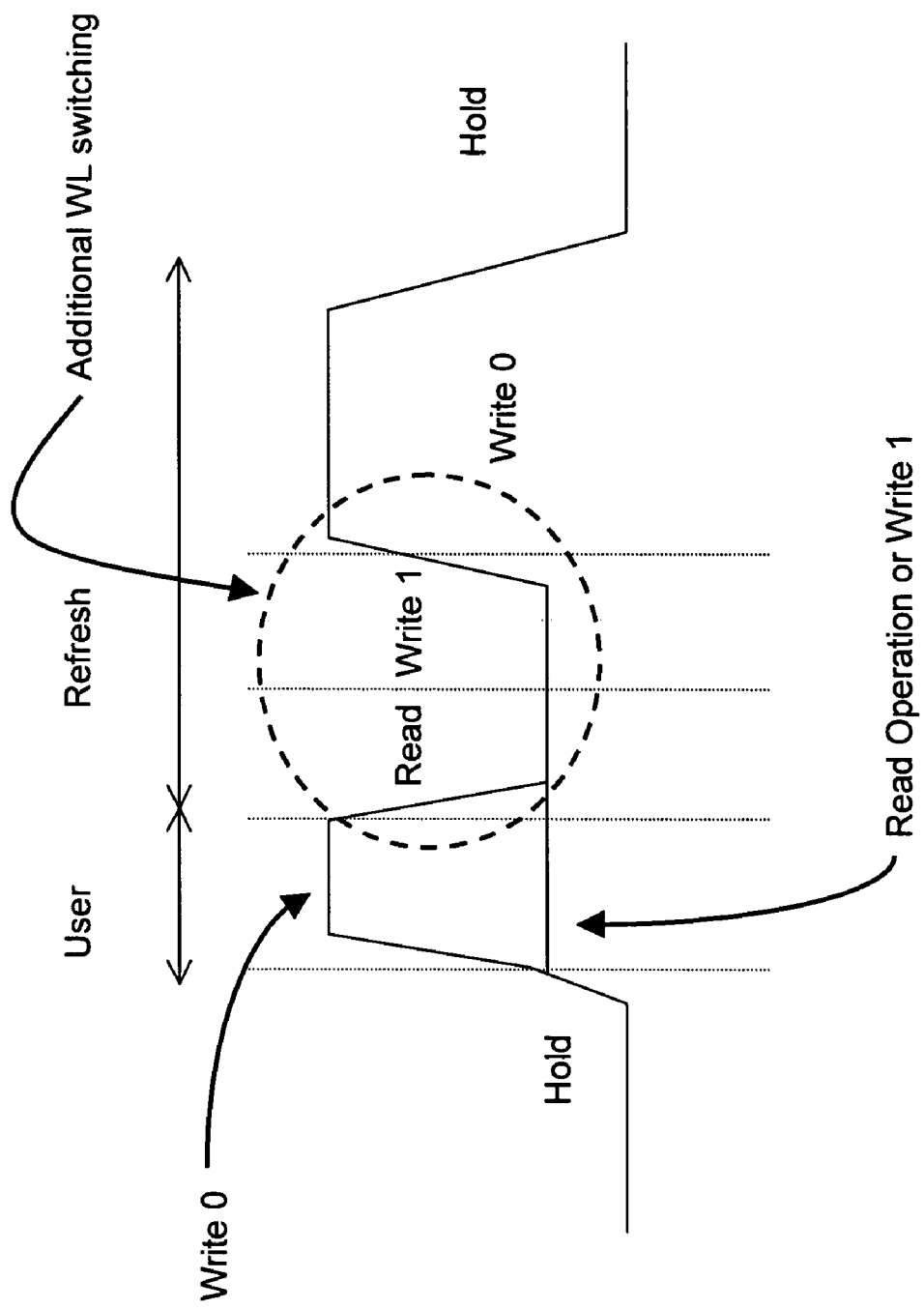
FIG. 9 illustrates an exemplary word (gate) line voltage waveform to be used in a method of a fifth embodiment of the present invention.
Figure 10:
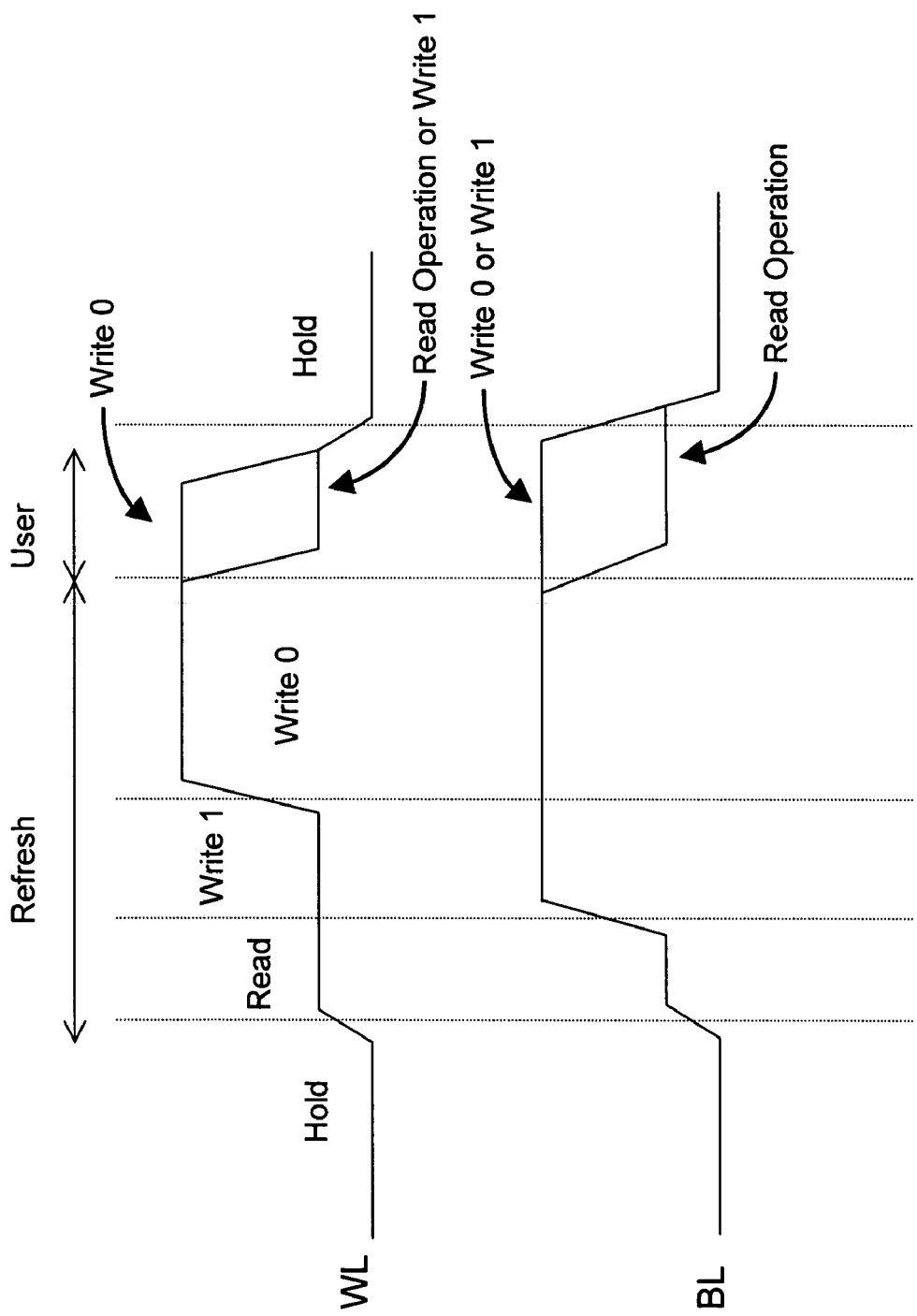
FIG. 10 illustrates a timing relationship between exemplary word (gate) line and the bit line voltage waveforms of the fourth embodiment of the present invention.

From a signaling perspective, with reference to FIG. 8, the variations or swings of the amplitude, as well as the polarity, of the gate voltages are reduced and/or minimized in number and rising/falling edges. Notably, a read or write operation of a predetermined memory cell may occur prior to the refresh operation. (See, for example, FIG. 9).

With reference to FIGS. 11 and 12, the semiconductor DRAM memory device of this aspect of the present invention includes a plurality of matrices 40a–n, each including a plurality of memory cells 12 (comprised of transistors 14). The memory cells 12 are arranged in arrays having rows and columns, which may be addressed by content address memory (CAM) 42 and column refresh counter 44. The column address output from column refresh counter 44 is applied to column address multiplexer 46. The column address multiplexer 46 receives the refresh address and the user address and provides one of the addresses to a column multiplexer 48 to select one of, for example, eight or sixteen bit lines (columns) 28a.

In order to enable memory cells 12 to be refreshed during, for example, idle periods (i.e., when there is no user access), memory cell 12 at the intersection of a given or selected row and a given or selected column is addressed by applying a signal on row address bus 50 to all of the interconnected gates of the row and a signal on column address bus 52 to all of the interconnected drains of the column. The row to be refreshed is identified by row refresh counter 54, which is gated, via row address multiplexer 56, with a row address from user address bus 58.

The column refresh counter 44 supplies a column address of a column to be refreshed. As mentioned above, the column address is gated, via column address multiplexer 46, with a column address from user address bus 58. As a result, the data state of memory cell 12 at the intersection of the selected row and column is determined and re-written to memory cell 12. The column refresh counter 44 may then increment in response to the same row being chosen, as a result of which the columns are sequentially addressed for each row, regardless of the order in which the rows are addressed. This provides the advantage of minimizing the risk that a memory cell 12 fails to be refreshed within the appropriate period. Depending on the phase during access, the column addresses are received from row refresh counter 44 or from user address bus 58, and when, for example, the device (or portion thereof) is idle, the row addresses are provided by row refresh counter 54.

Notably, the refresh technique and circuitry of FIG. 11 may be used with several arrays in parallel, as a result of which the number of sense amplifier 60 may be reduced and/or minimized (as is the area required for such circuitry on the die).

With reference to FIG. 12, when a column is selected, the signal on WLDPW line 62 provides a power supply voltage to word line drivers 62a–x, according to the phase in the cycle waveform. The column multiplexer 48 addresses the column (and therefore the selected memory cell) to be refreshed, and the data in the selected memory cell is read by sense amplifier 60, the result being output (i.e., DATA signal) on signal line 66.

According to the signal logic levels on line 62 (after conversion by voltage converter 68) and line 66, the write conditions applied to the word line are as follows: During write "1" condition, if the DATA signal is "1", XNOR logic gate 68 outputs, on signal line 68, a logic high (i.e., binary "1") which is amplified by write amplifier 72 and then applied to the selected memory cell in order to restore the data state in the selected memory cell. If the DATA signal is "0", a logic low (i.e., "0") is applied to the bit line, which represents a holding condition. While writing data state "0", on the other hand, if the DATA signal is "0", the XNOR logic gate 68 outputs a logic high (i.e., binary "1"), which is amplified by write amplifier 72 and then applied to the memory cell to restore its data. If the DATA signal is "1", a "0" is applied to the bit line, which again represents a holding condition.

In certain embodiments, it may be advantageous to further reduce, minimize and/or eliminate any issues of disturbance (for example, issues of stored charge loss or gain within memory cells) of the data states of memory cells having common gate lines, drain lines and/or source lines with those memory cells that are being accessed (i.e., being read from or written to during, for example, a normal or refresh operation). In one embodiment, a two-step write operation may be employed to program memory cell 12 with little to no disturbance to adjacent and/or neighboring cells (i.e., cells that share source lines, drain lines and/or gate lines). In this regard, an entire row of memory cells may first be written to the same logic state and thereafter, individual bits are written to the opposite state in accordance with a desired data state (i.e., the individual bits are written to another state to reflect a desired data state).

It is intended that such two step write technique may be employed using many different memory cells and many different memory array architectures, whether now known or later developed; and all such memory cells and different memory array architectures fall within the present invention. For example, the write technique may be implemented where memory cells 12a–d of each row 80a–f of transistors have a dedicated source line to minimize, reduce and/or eliminate disturbance on adjacent rows (for example, row 80b versus row 80c).

Figure 13A:
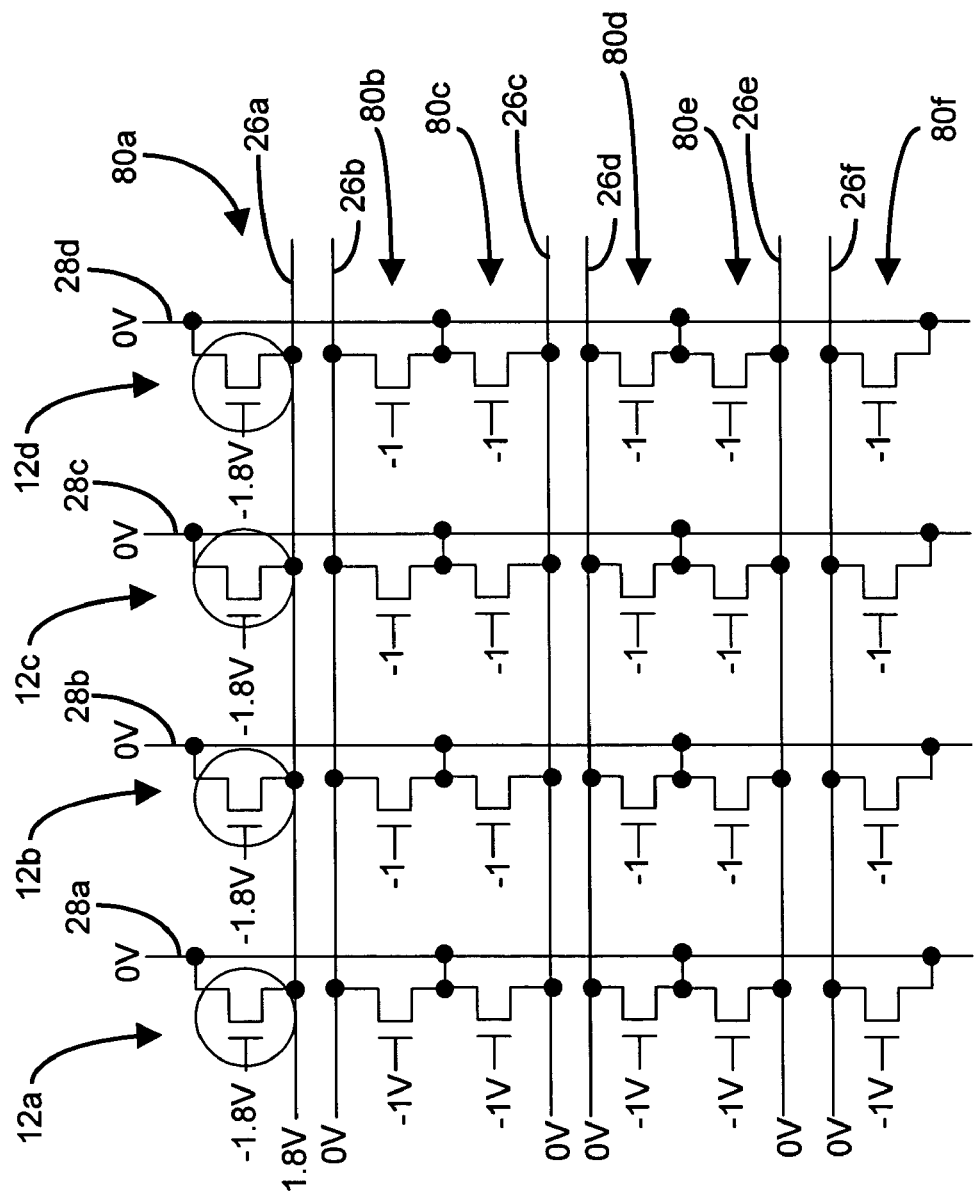
FIGS. 13A, 13B, 14A and 14B illustrate a memory array including a plurality of memory cells having a separate source line array that define a particular row of memory cells, and exemplary writing and/or programming techniques (including exemplary programming voltage values), according to another aspect of the present invention.
Figure 13B:
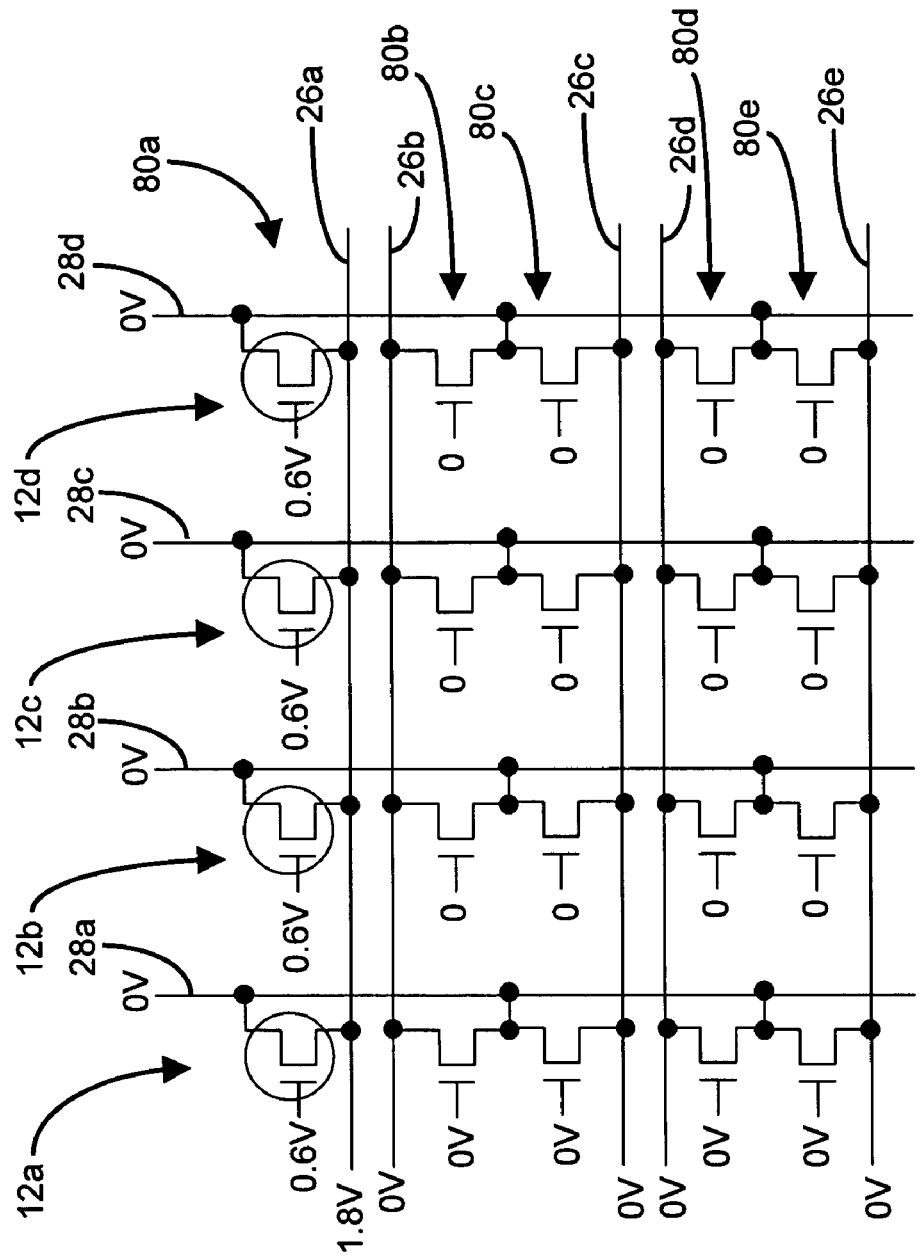

With reference to FIGS. 13A and 13B, in one embodiment, a given row 80a–f may be written to by applying a clear operation followed by a selective write operation. In this regard, a plurality of memory cells 100, having gates that are connected to a common gate line, are arranged to form row 80a. Exemplary voltages that implement a clear operation for row 80a and maintain the remaining portion of the array (i.e., rows 80b–f) in a fixed state (i.e., unchanged in response to the clear operation) are indicated in FIGS. 13A and 13B. In response, the same logic state (for example, logic high or binary "1") is stored in memory cells 12a–d of row 80a. In this way, the state of memory cells 12a–d are "cleared".

Figure 14A:
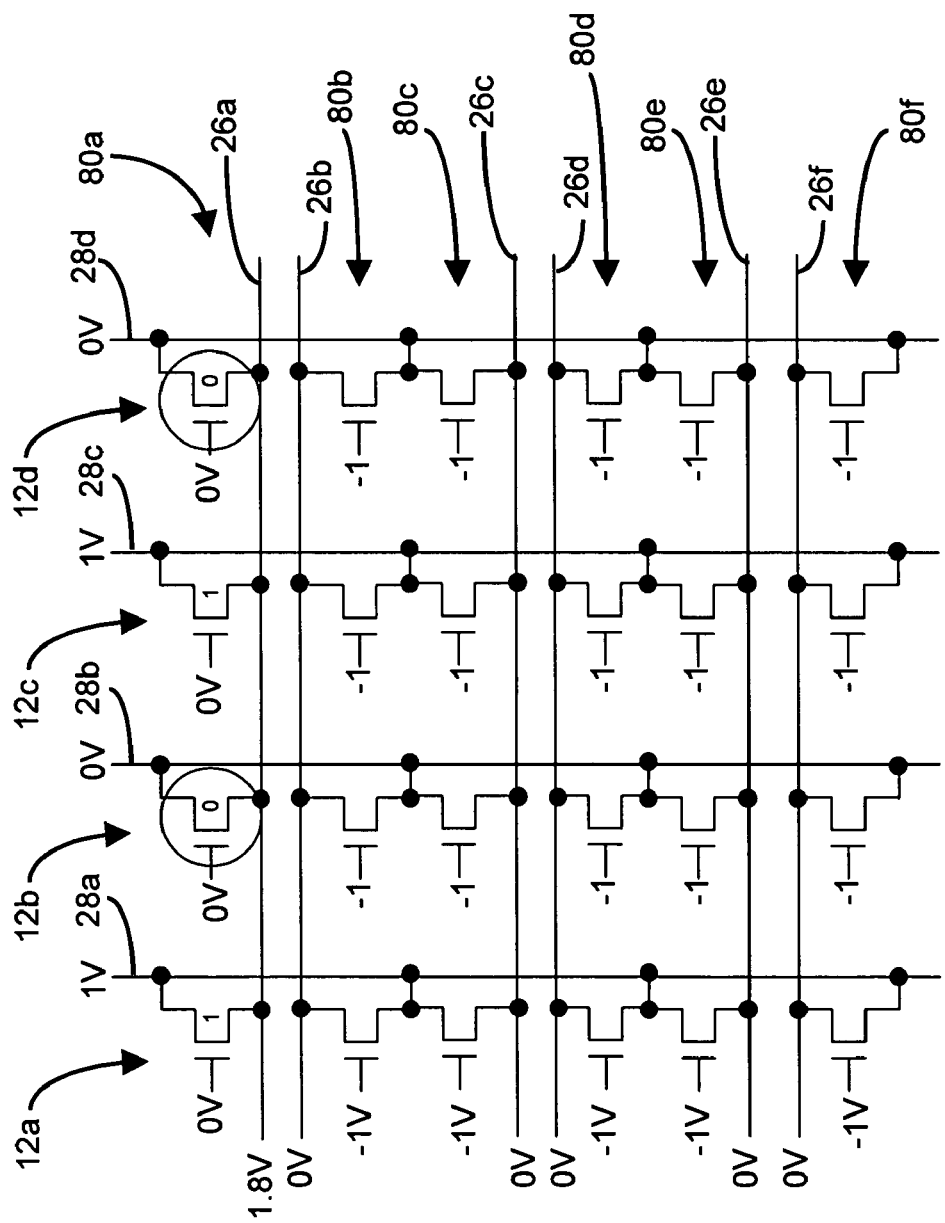
Figure 14B:
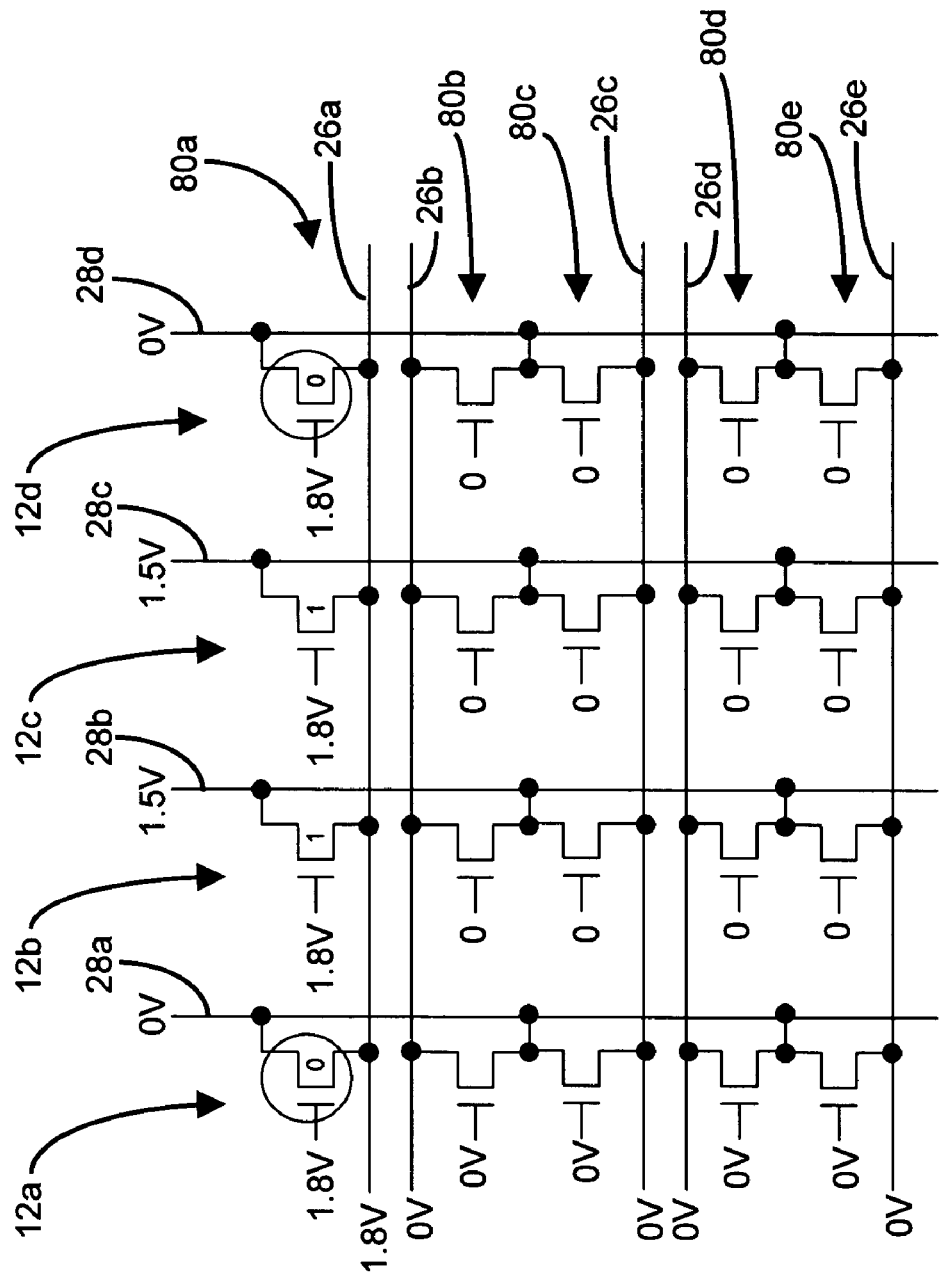

Thereafter, individual transistors of memory cells 12a–d of row 80a are written to a particular, desired and/or predetermined logic state (see, for example, FIGS. 14A and 14B) in order to store the particular, desired and/or predetermined logic state in memory cells 12a–d. In particular, with reference to FIG. 14A, as described above, memory cells 12a–d are set to logic high (binary "1") by the clear operation, and then memory cells 12b and 12d are written to logic low (binary "0"). Notably, the logic state of memory cells 12a and 12c remains logic high during the write operation (via applying an inhibit voltage to the associated bit lines 28a and 28c (FIG. 14A). With reference to FIG. 14B, memory cells 12a–d are cleared to logic high (binary "1") and then memory cells 12a and 12d are written to logic low (binary "0"). Memory cells 12b and 12c remain logic high via a write inhibit voltage applied to associated bit lines 28b and 28c.

Figure 15A:
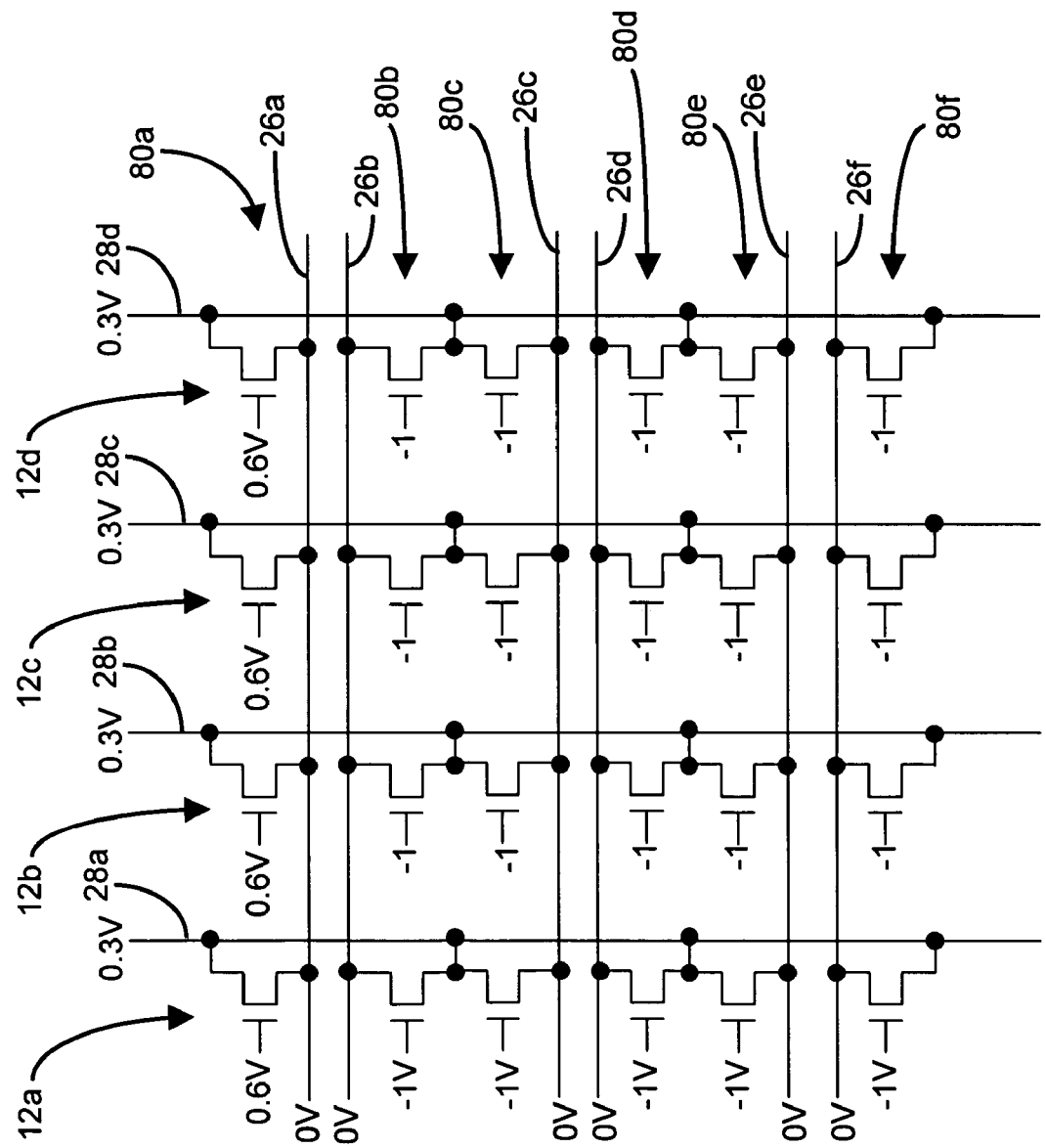
FIGS. 15A and 15B illustrate read operations, including exemplary read operation voltage values, according to an embodiment of the present invention, for the memory array of FIGS. 13A, 13B, 14A and 14B.
Figure 15B:
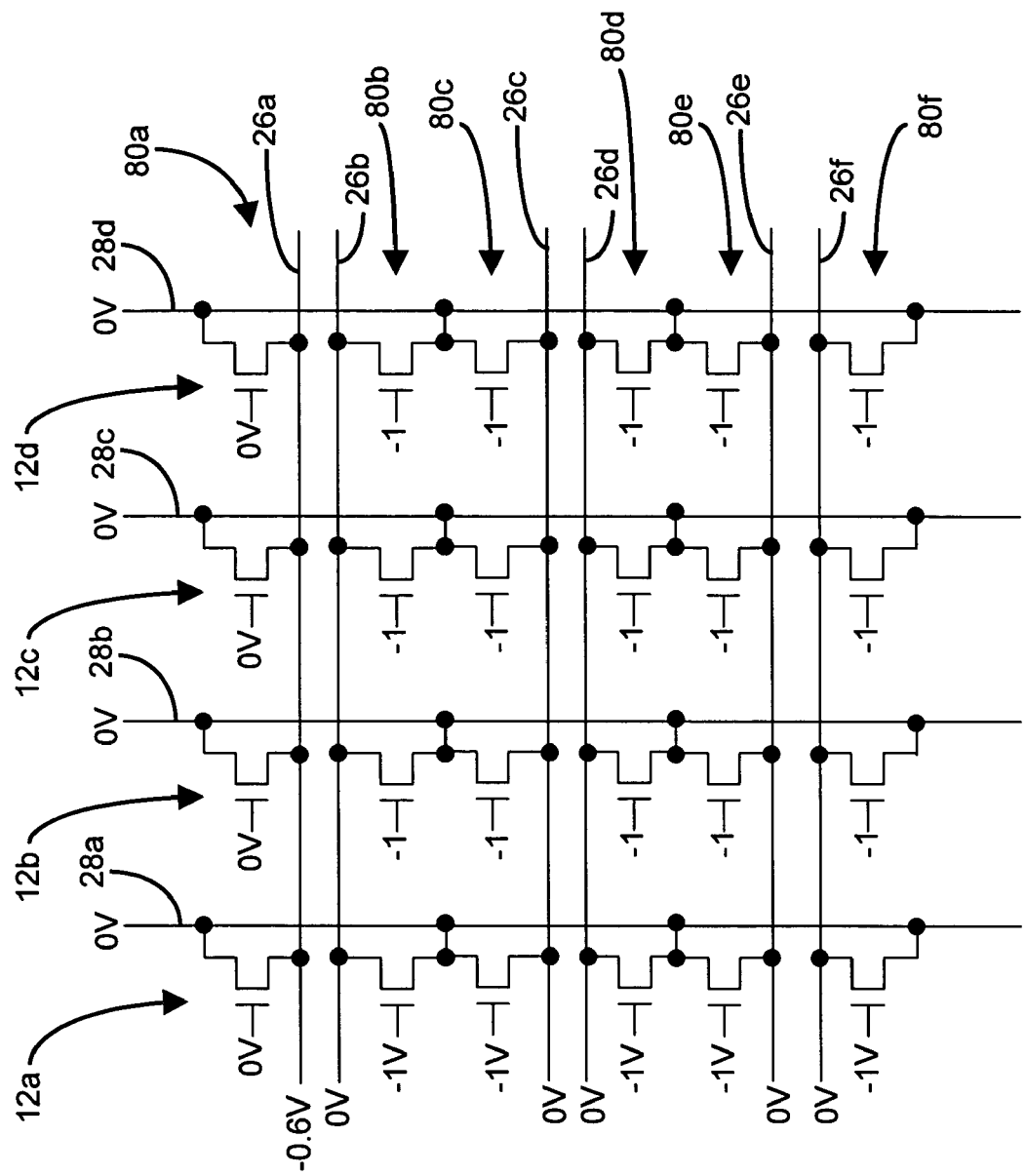
Figure 16:
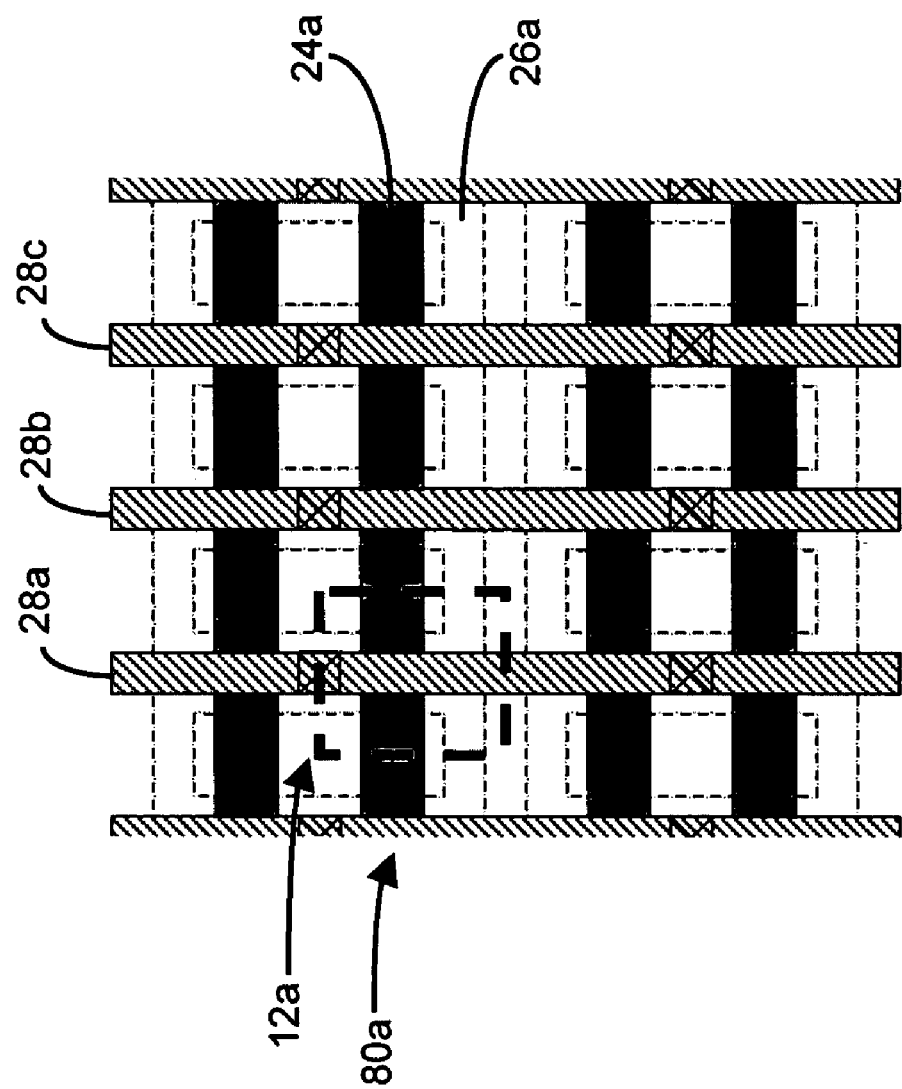
FIG. 16 illustrates an exemplary layout of the memory array of FIGS. 13A, 13B, 14A and 14B.

With reference to FIGS. 15A and 15B, the data may be read from memory cells 12a–d of row 80b by applying the exemplary voltages indicated. An exemplary holding voltage for the remaining portion of the array (including the memory cells of row 80b–f) is also indicated. The holding voltage/signal maintains the unselected portion of the array in a fixed state (i.e., unchanged in response to the read operation). Notably, the exemplary read and holding voltages of FIGS. 15A and 15B may avoid, reduce and/or minimize charge pumping disturb.

Thus, in this embodiment, the first step of the write operation clears the memory cells having a common source line and the second step writes or stores new data or the previous data (in the event that the data did not change). Array architectures employing this write operation technique may have an advantage that the unselected memory cells of the array are not "disturbed" (or experience little and/or negligible disturbance) because "high" voltages are applied in the row direction (i.e., on source lines 26) but not in the column direction (i.e., on the drain or bit lines 28). This write technique may be performed as a page mode write where the page is first "cleared" and then individual bytes (or bits) in a page are written to a new state.

Notably, the memory architecture, write and/or programming techniques, and read techniques of FIGS. 13A, 13B, 14A, 14B, 15A and 15B may be implemented in conjunction with the embodiments of the device of FIGS. 11 and 12. For the sake of brevity, those discussions will not be repeated.

Figure 17:
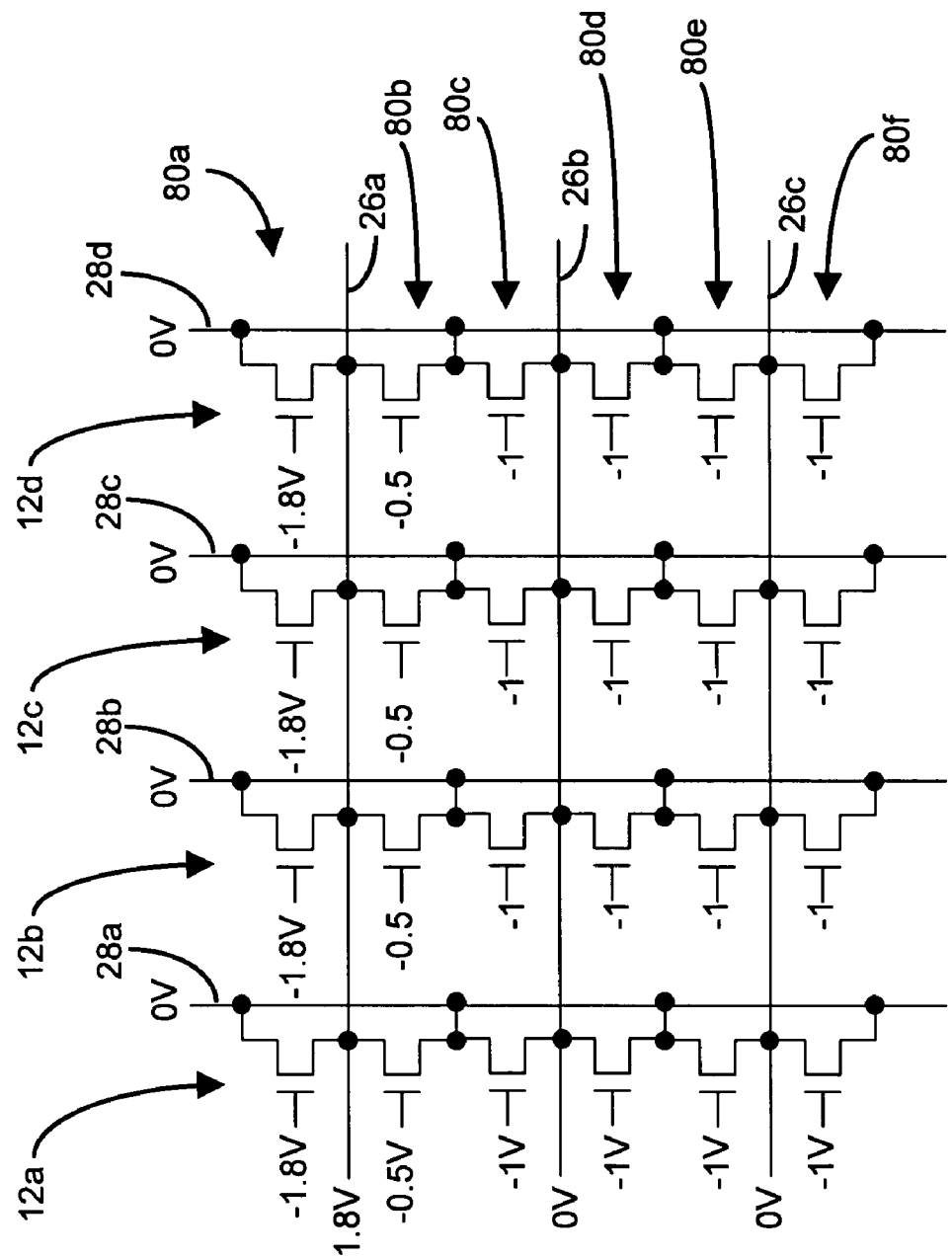
FIGS. 17 and 18 illustrate another memory array architecture including a plurality of memory cells having a common source line array, and writing and/or programming techniques (including exemplary programming voltage values), according to another aspect of the present invention.
Figure 18:
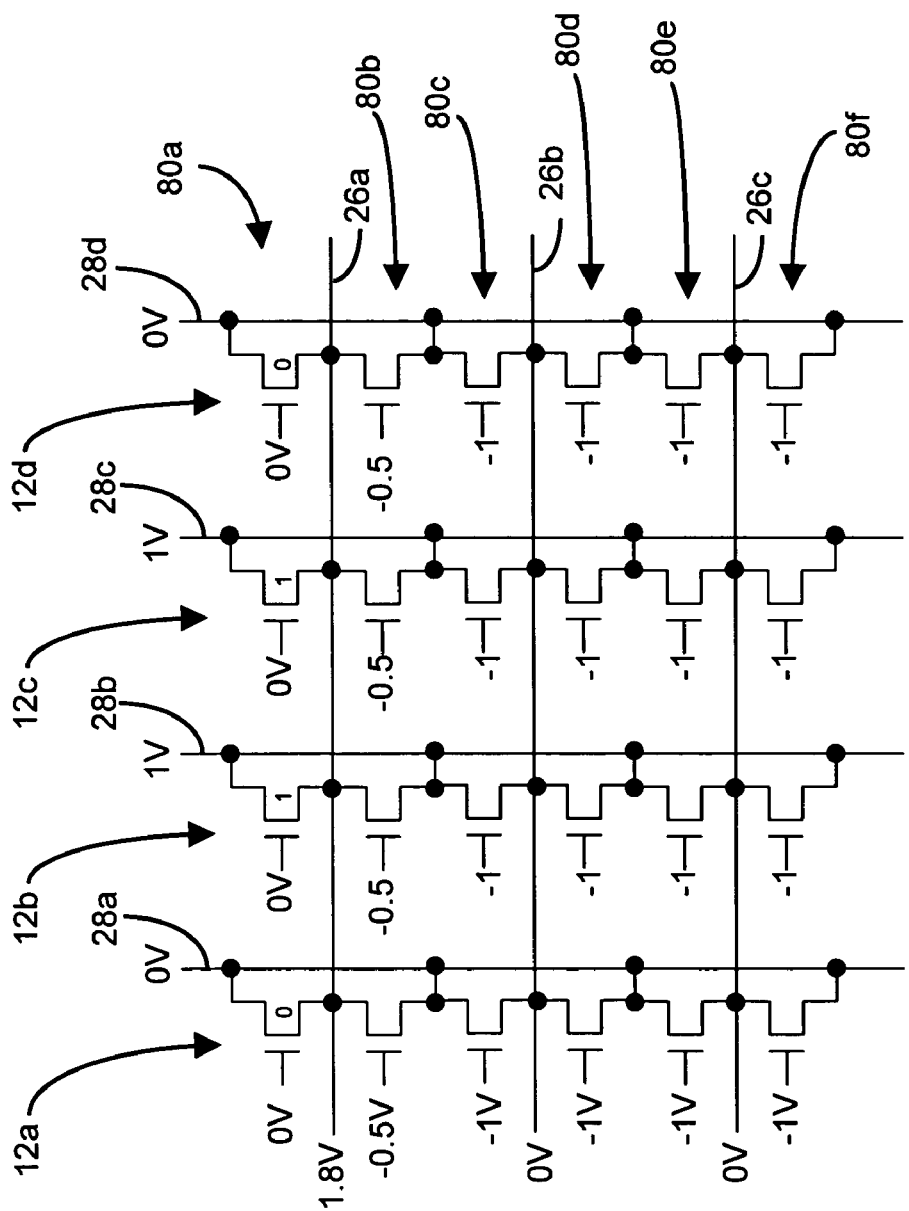

FIGS. 17–20 illustrate another memory array architecture in which a plurality of memory cells "share" a source line and employ the two-step write technique that may eliminate, minimize and/or reduce disturbance to memory cells when reading from and/or writing to adjacent memory cells. In this regard, with reference to FIGS. 17 and 18, in one embodiment, a given row may be written to by applying suitable voltages to implement a clear operation (FIG. 17) followed by a selective write operation (FIG. 18). In conjunction with applying suitable voltages to implement the clear operation, a write inhibit signal is applied to the gates of memory cells that share a source line 26 (for example, a write inhibit signal may be applied to the gates of the memory cell of row 80b). Notably, any disturbance on unselected, adjacent row 80b (with respect to row 80a), may avoid, reduce and/or minimize by biasing word line 24b to an intermediate value that balances write logic low (i.e., write "0") and write logic high (i.e., write "1") operation.

In particular, exemplary voltages that implement a clear operation for row 80a and maintain the neighboring memory cells (for example, memory cells of row 80b) remaining portion of the array in a fixed state (i.e., unchanged in response to the clear operation) are indicated in FIG. 17. The memory cells 12a–d of row 80a are written to a particular, desired and/or predetermined logic state (see, for example, FIG. 18 (write "0") in memory cell 12a and memory cell 12d and (write "1") in memory cell 12b and memory cell 12c) in order to store a particular, desired and/or predetermined logic state of memory cell 12.

Figure 19:
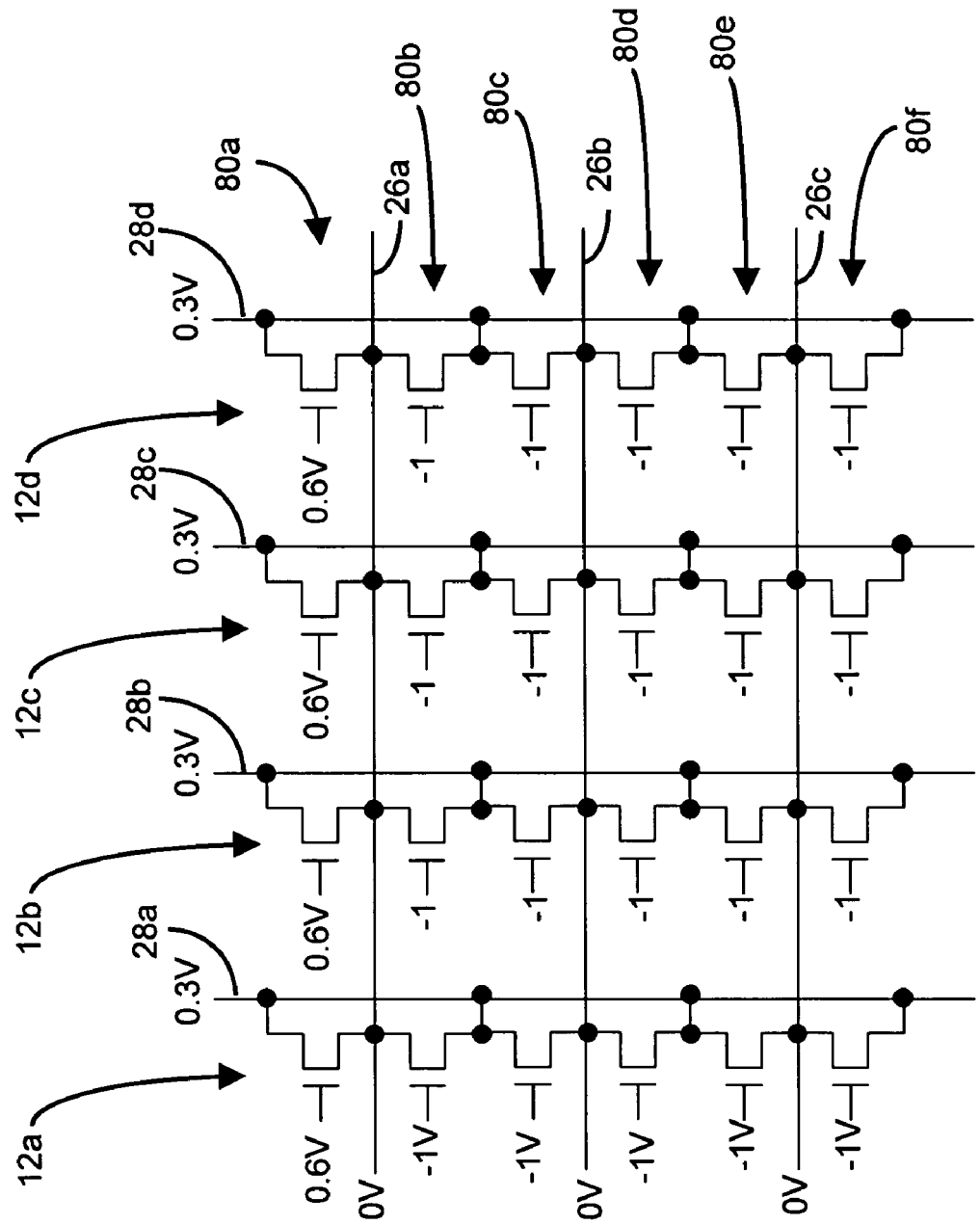
FIG. 19 illustrates exemplary read operation voltage values, according to an embodiment of the present invention, for the memory array of FIGS. 17 and 18.
Figure 20:
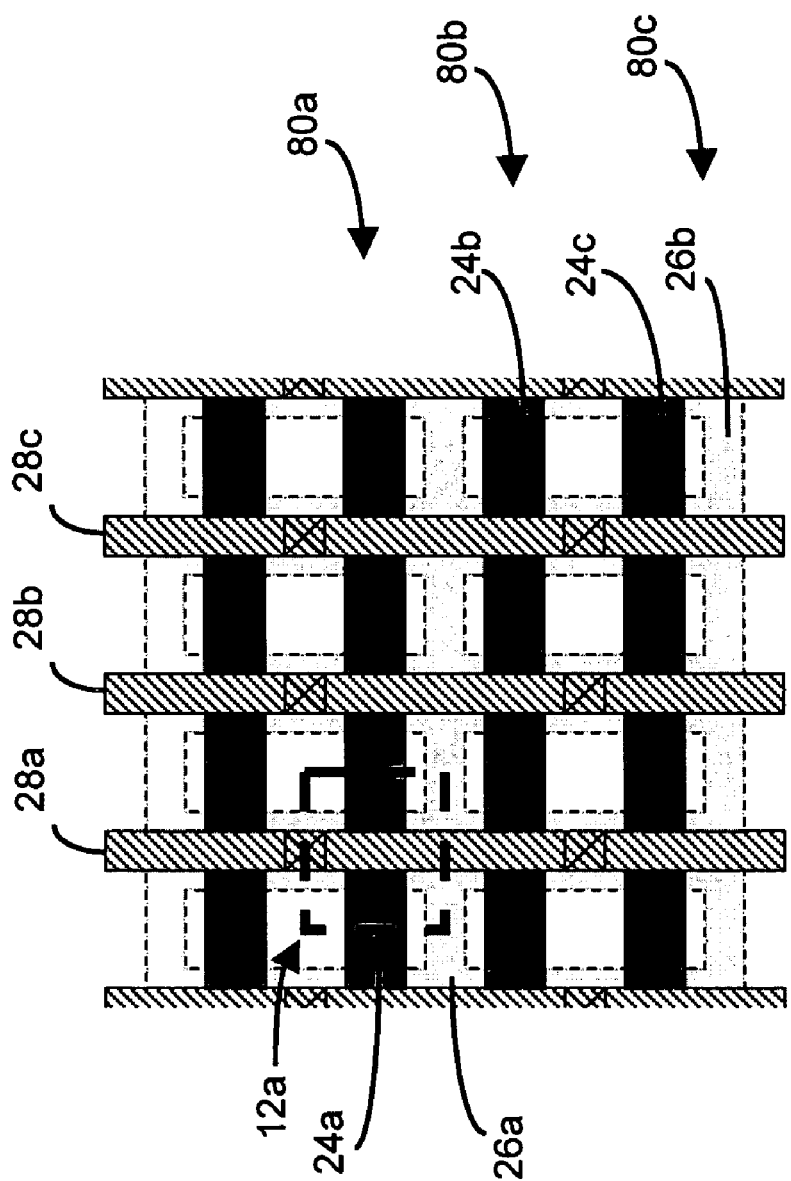
FIG. 20 illustrates an exemplary layout of the memory array of FIGS. 17 and 18.

With reference to FIG. 19, the data may be read from memory cells 12a–d of row 80a by applying the exemplary voltages indicated. Notably, an exemplary holding voltage for the remaining portion of the array (including the neighboring memory cells of row 80b as well as the memory cells of rows 80c–f) is also indicated. The holding voltage/signal maintains the unselected portion of the array in a fixed state (i.e., unchanged in response to the read or write operation).

The memory architecture, write and/or programming techniques, and read techniques of FIGS. 17–20 may be implemented in conjunction with the embodiments of the device of FIGS. 11 and 12. For the sake of brevity, those discussions will not be repeated.

Figure 21:
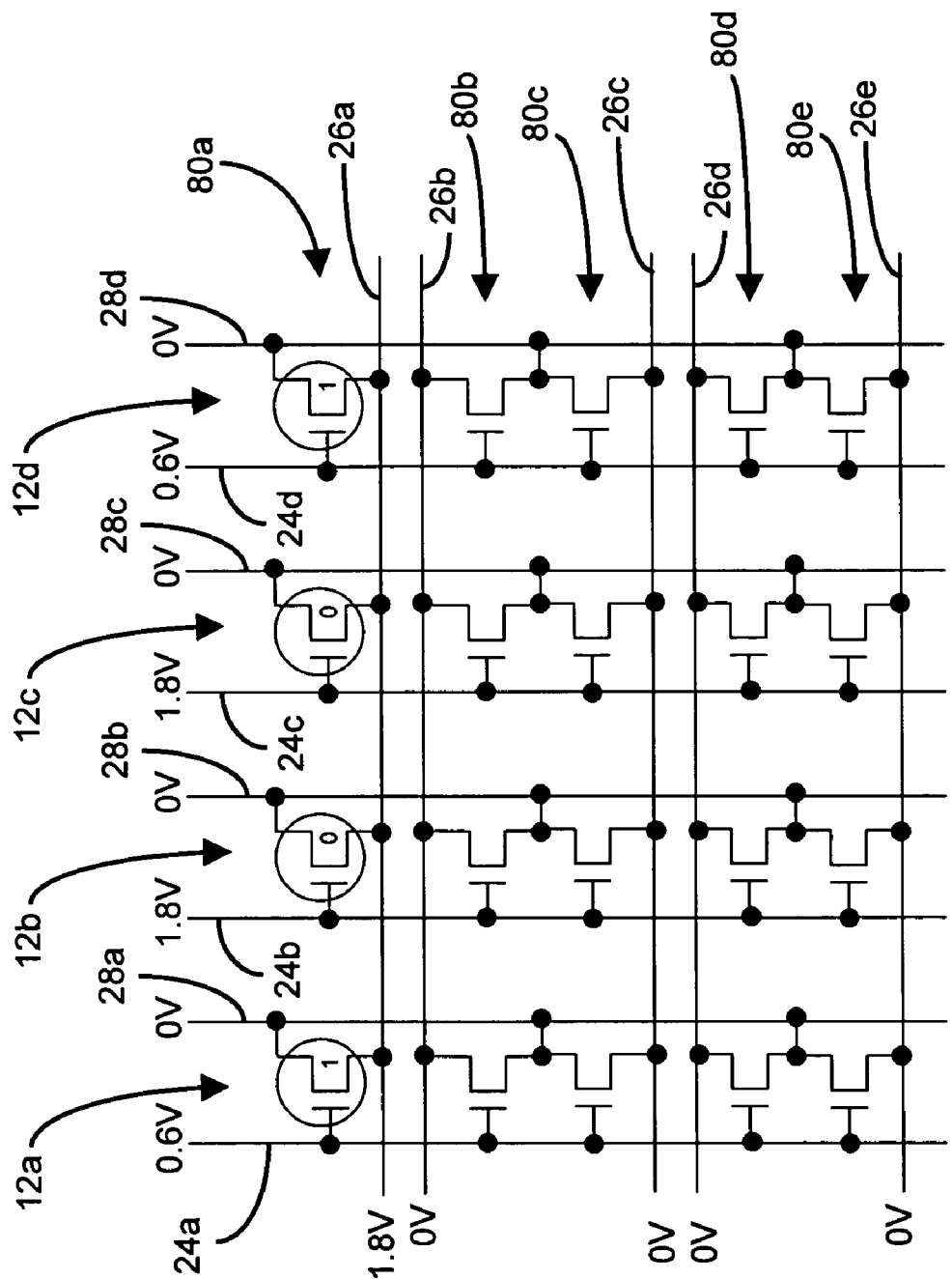
FIG. 21 illustrates a memory array including a plurality of memory cells having a separate source line array (that define a particular row of memory cells) and gates lines that are parallel to associated bit lines, and exemplary writing and/or programming techniques (including exemplary programming voltage values), according to another aspect of the present invention.
Figure 22:
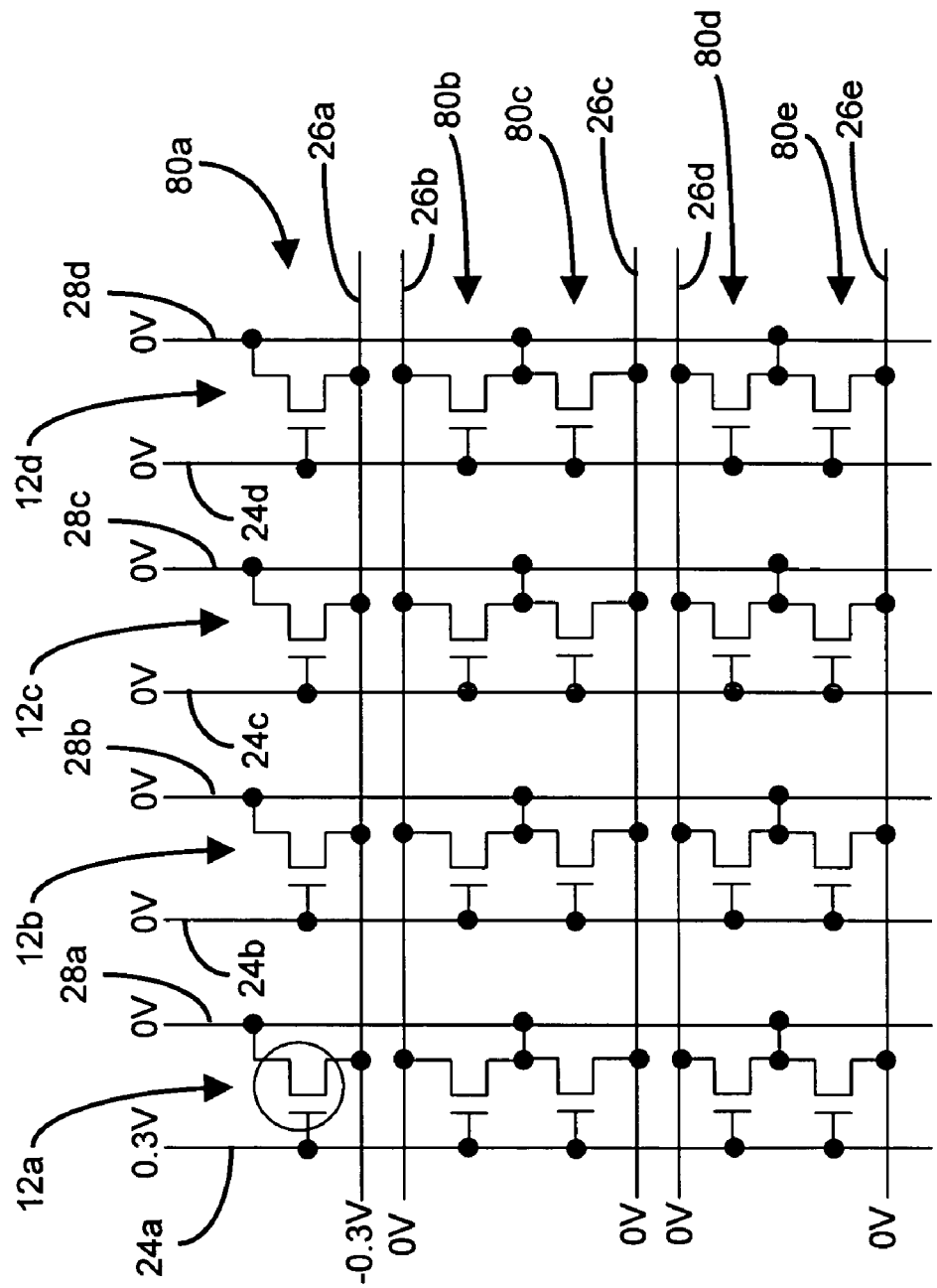
FIG. 22 illustrates exemplary read operation voltage values, according to an embodiment of the present invention, for the memory array of FIG. 21.
Figure 23:
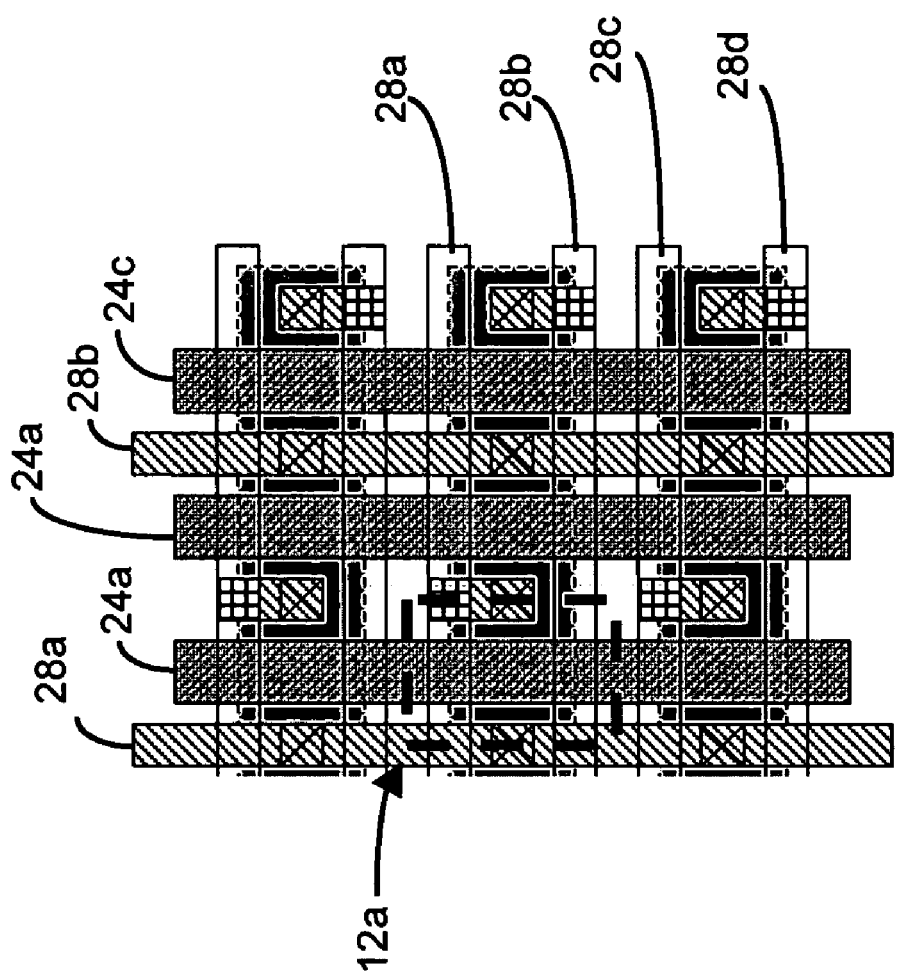
FIG. 23 illustrates an exemplary layout of the memory array of FIGS. 21 and 22.
Figure 24:
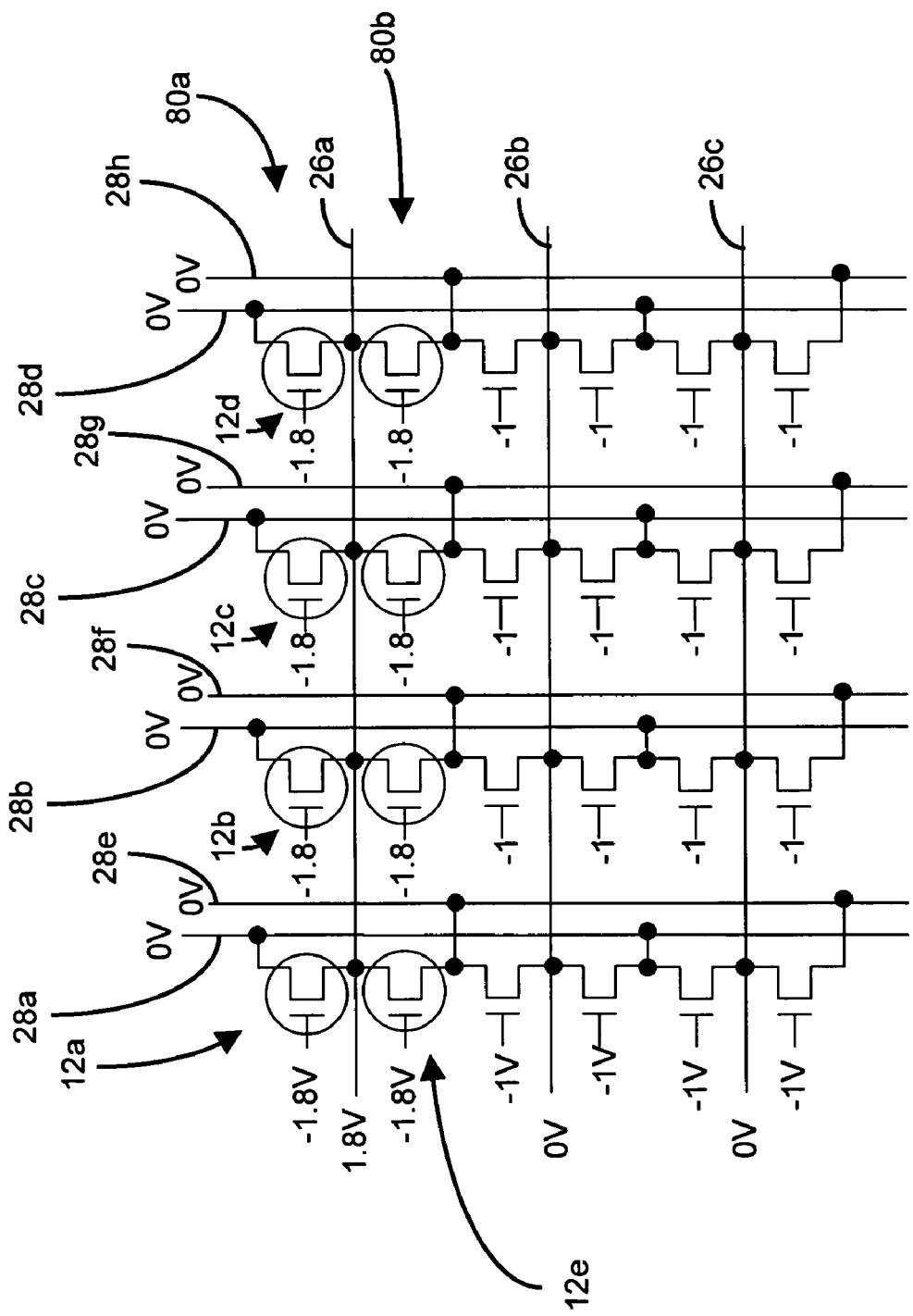
FIGS. 24 and 25 illustrate another memory array architecture including a plurality of memory cells having a common source line array, and writing and/or programming techniques (including exemplary programming voltage values), according to another aspect of the present invention.

Another memory array architecture that may employ a one-step write technique that eliminates, minimizes and/or reduces disturbance to memory cells when reading from and/or writing to adjacent memory cells is illustrated in FIGS. 21–23. In this architecture, source lines 26 are separated for each row 80a–e. In addition, word lines 24a–d are arranged parallel to associated bit lines 28a–d, respectively.

With reference to FIG. 21, in one embodiment, a given row may be written to by applying suitable voltages to directly implement a write operation (see, memory cells 12a–d of row 80a). In conjunction with applying suitable voltages to implement the write operation, a write inhibit signal is applied to source lines 26b–e of rows 80b–e, respectively. Exemplary voltages that implement the write operation (for memory cells 12a–d) and the inhibit state (for the memory cells of rows 80b–e) are indicated in FIG. 21. The memory cells 12a and 12d of row 80a are maintained and/or written to a particular, desired and/or predetermined logic state (here, write "1") and memory cells 12b and 12c are written to a different desired and/or predetermined logic state (here, write "0").

With reference to FIG. 22, the data may be read from memory cell 12a of row 80a by applying the exemplary voltages indicated. Notably, an exemplary read inhibit voltage for the remaining portion of the array (including the other memory cells of row 80a and the memory cells of rows 80d–e) is also indicated. The read inhibit voltage/signal maintains the unselected portion of the array in a fixed state (i.e., unchanged in response to the read operation).

The memory architecture, write and/or programming techniques, and read techniques of FIGS. 21–23 may be implemented in conjunction with the embodiments of the device of FIGS. 11 and 12. For the sake of brevity, those discussions will not be repeated.

Another memory array architecture that may employ the two-step write technique that eliminates, minimizes and/or reduces disturbance to memory cells when reading from and/or writing to adjacent memory cells is illustrated in FIGS. 24–27. In this architecture, the source lines are shared but bit lines are separated so each memory cell on either side of a source line, for example memory cells 12, has a dedicated bit line. The gates of transistors 12a and 12e may be connected together at the array boundary.

Notably, memory cells 12a and 12e are located on separate rows with the gates of each transistor 12a and 12e connected at, for example, the array boundary. In this embodiment, there is a separate bit line (here, drain lines 28a and 28e) for each memory cell 12a and 12e so that each transistor 12a and 12e may be read separately.

Figure 25:
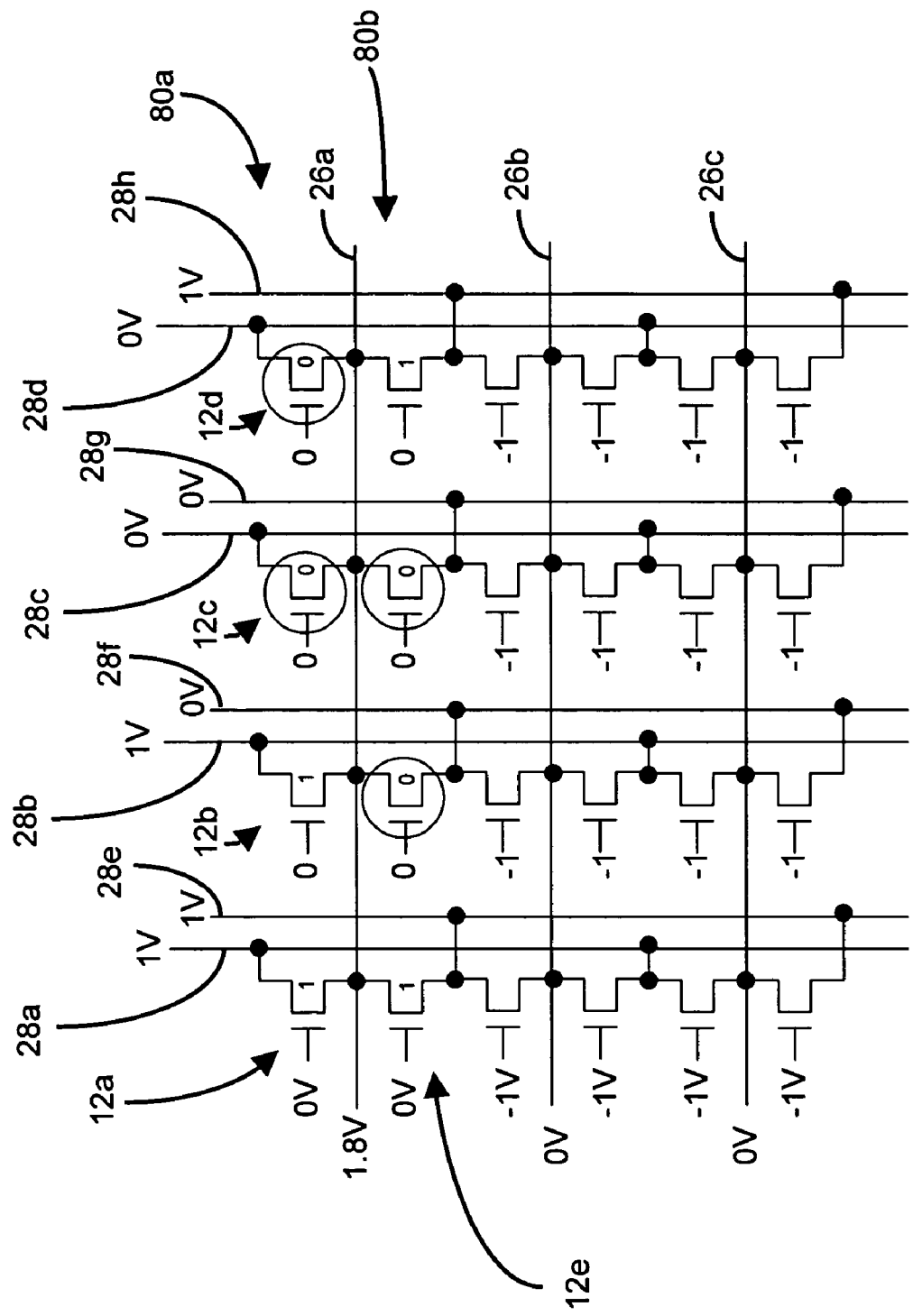
Figure 26:
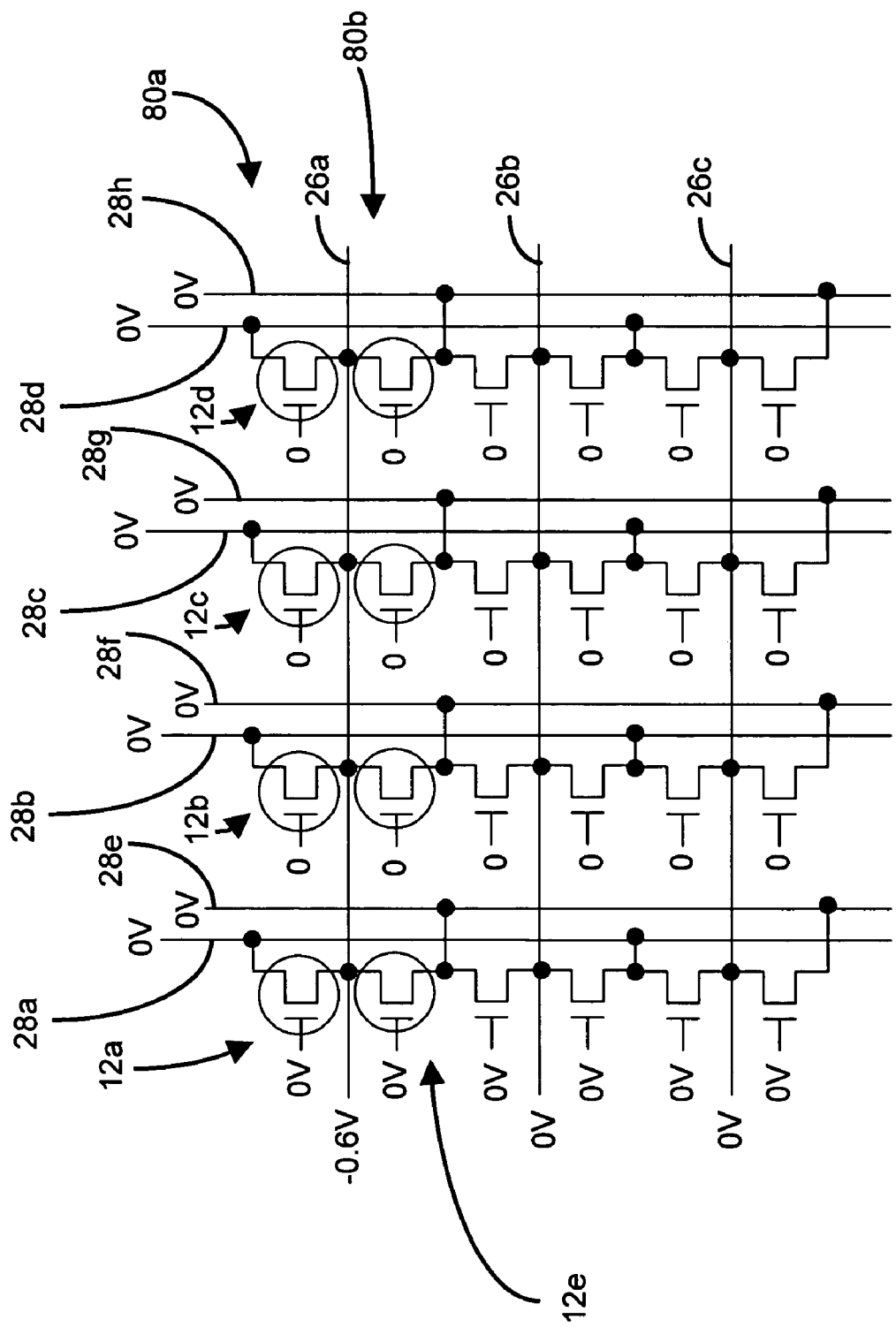
FIG. 26 illustrates exemplary read operation voltage values, according to an embodiment of the present invention, for a memory array of FIGS. 25 and 26.
Figure 27:
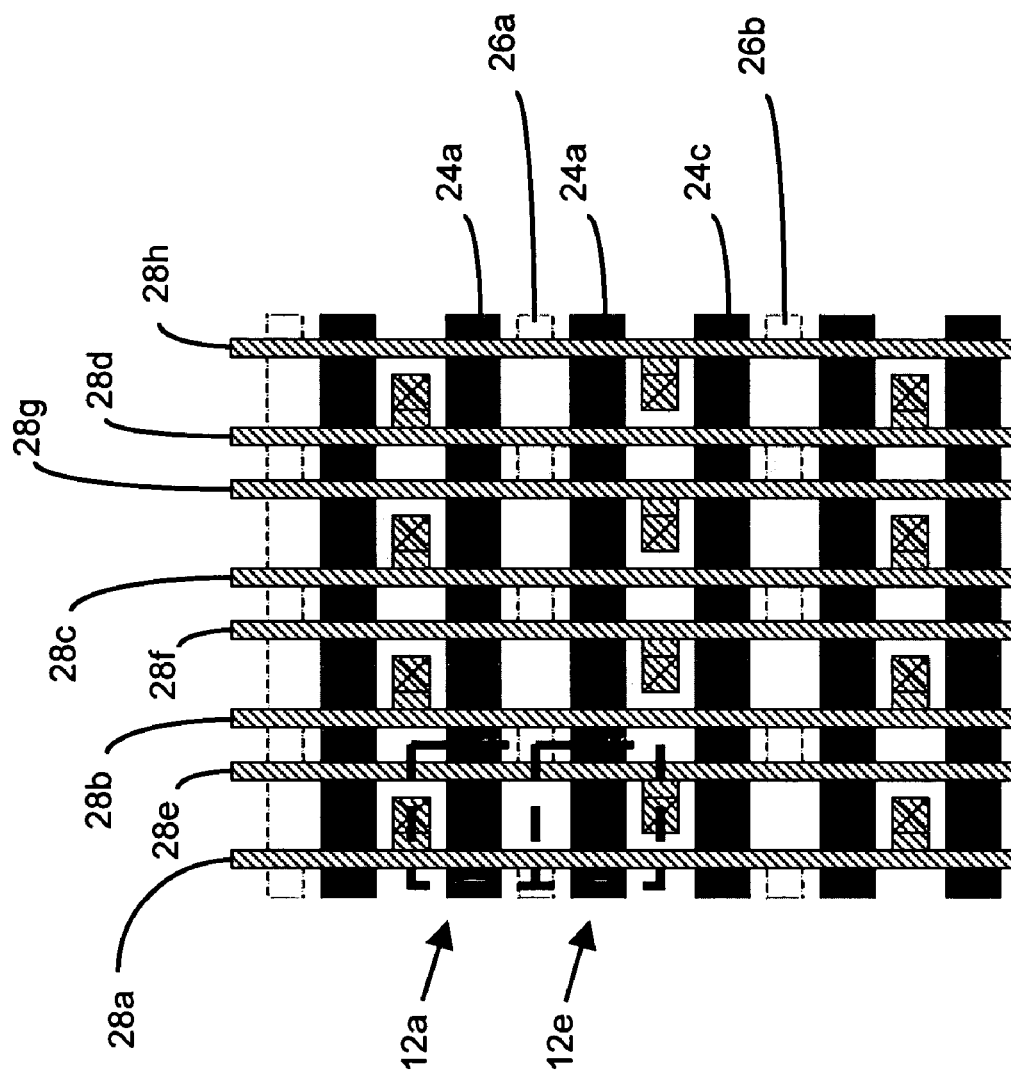
FIG. 27 illustrates an exemplary layout of the memory array of FIGS. 24 and 25.

With reference to FIGS. 24–27, in one embodiment, a given pair of rows may be written to by applying suitable voltage to implement a clear operation (FIG. 24) followed by a selective write operation (FIG. 25). The pair of rows (for example, rows 80a and 80b) corresponding to memory cells 12a and 12e, on either side of a common source line, are written and read (FIG. 26) simultaneously.

Notably, the memory architecture, write and/or programming techniques, and read techniques of FIGS. 24–27 may be implemented in conjunction with the embodiments of the device of FIGS. 11 and 12. For the sake of brevity, those discussions will not be repeated.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, as mentioned above, the illustrated voltage levels to implement the write and read operations are exemplary. The indicated voltage levels may be relative or absolute. That is, for example, a logic low may be written into transistor 102a (see, for example, FIG. 13A) using the voltages indicated therein. Alternatively, the voltages indicated may be relative in that each voltage level, for example, may be increased or decreased by a given voltage amount (for example, each voltage may be increased by 0.25 volts).

Moreover, while a significant portion of this description includes details (for example, clear, write, read and inhibit voltages) directed to N-channel transistors, the inventions (and embodiments thereof, described herein are entirely applicable to P-channel transistors. In such embodiments, majority carriers 30 in body region 18 are electrons and minority carriers 34 are holes. Indeed, the memory arrays of matrices 40a–n may be comprised of N-channel, P-channel and/or both types of transistors. Moreover, the circuitry that is peripheral to the memory array (for example, row and column address decoders, not illustrated herein, as well as comparators) may include P-channel and/or N-channel type transistors, including transistors like transistor 14.

Notably, where P-channel type transistors are employed as memory cells 12 in the memory array(s) of matrices 40a–n, suitable clear, write, read and inhibit voltages are well known to those skilled in the art in light of this disclosure. Accordingly, for sake of brevity, these discussions will not be repeated.

Further, memory cell(s) 12 (as well as memory array and matrices 40a–n) may also employ the structure, features, attributes, architectures, configurations, materials, techniques and advantages described and illustrated in non-provisional patent application entitled "Semiconductor Device", which was filed on Feb. 18, 2004, by Fazan and Okhonin, and assigned Ser. No. 10/487,157 (hereinafter "Semiconductor Device Patent Application"). The entire contents of the Semiconductor Device Patent Application, including, for example, the inventions, features, attributes, architectures, configurations, materials, techniques and advantages described and illustrated therein, are hereby incorporated by reference herein.

Figure 28:
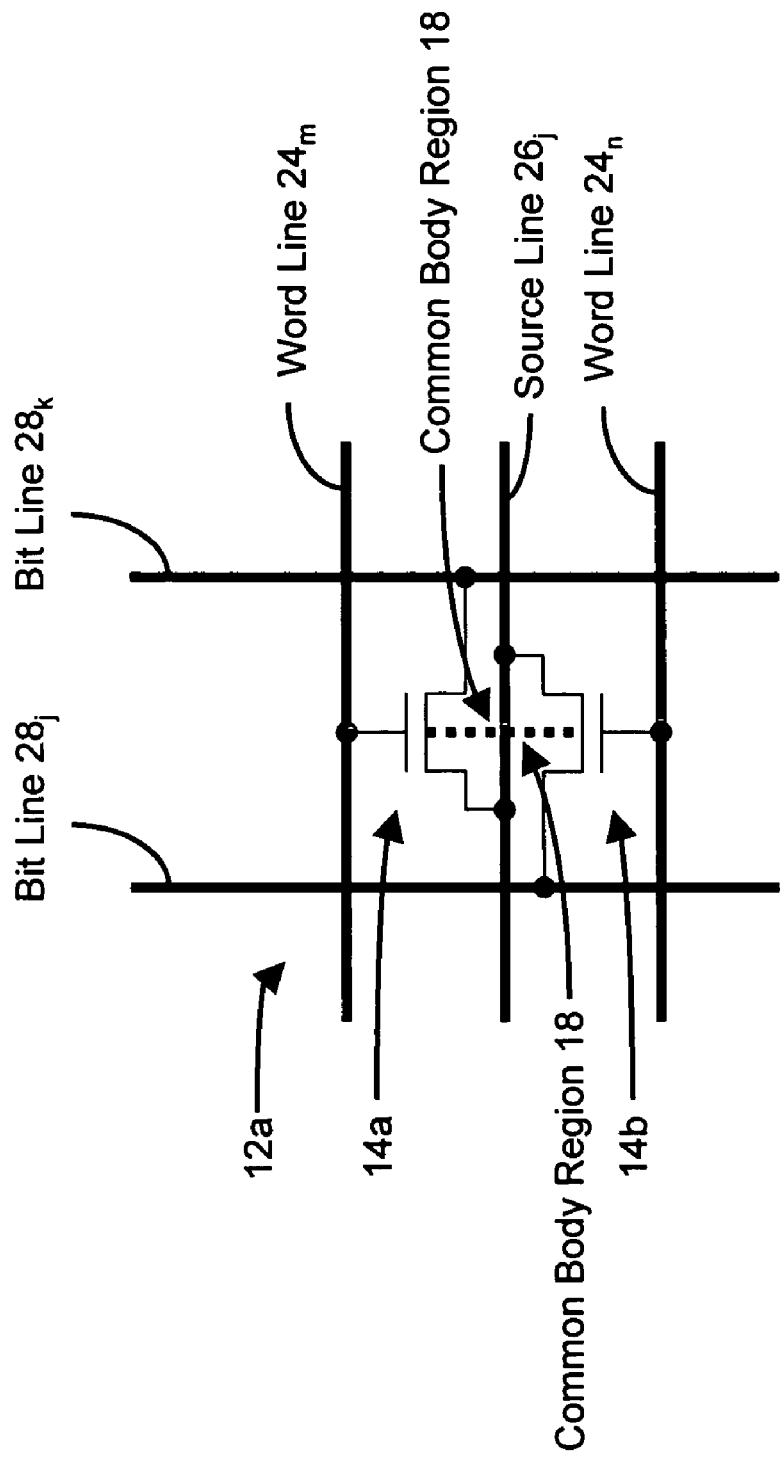
FIG. 28 illustrates an exemplary configuration of a dual-port or a multi-port memory cell, according to another aspect of the present invention.

Furthermore, the memory transistors and/or cells, and method of operating such transistors and/or cells, of the present invention may be implemented in many different configurations. For example, the floating body regions of two or more transistors may be shared to realize a dual-port or a multi-port memory cell. In this regard, with reference to FIG. 28, a dual port memory cell 12a may include transistors 14a and 14b. A dual port memory array may include a plurality of dual port memory cells 12 arranged, for example, in a matrix of rows and columns. The data state defined by the amount of carriers in the common electrically floating body region 18 is common to the two transistors 14a and 14b.

The read and write access operations may be performed independently for transistors 14a or 14b, using the respective independent word lines 24, source line 26 and bit lines 28. In the illustrative example, source line 26 is common to the transistors 14a and 14b of memory cell 12a. Notably, the source regions of transistors 14a and 14b may be connected to separate source lines.

Figure 29:
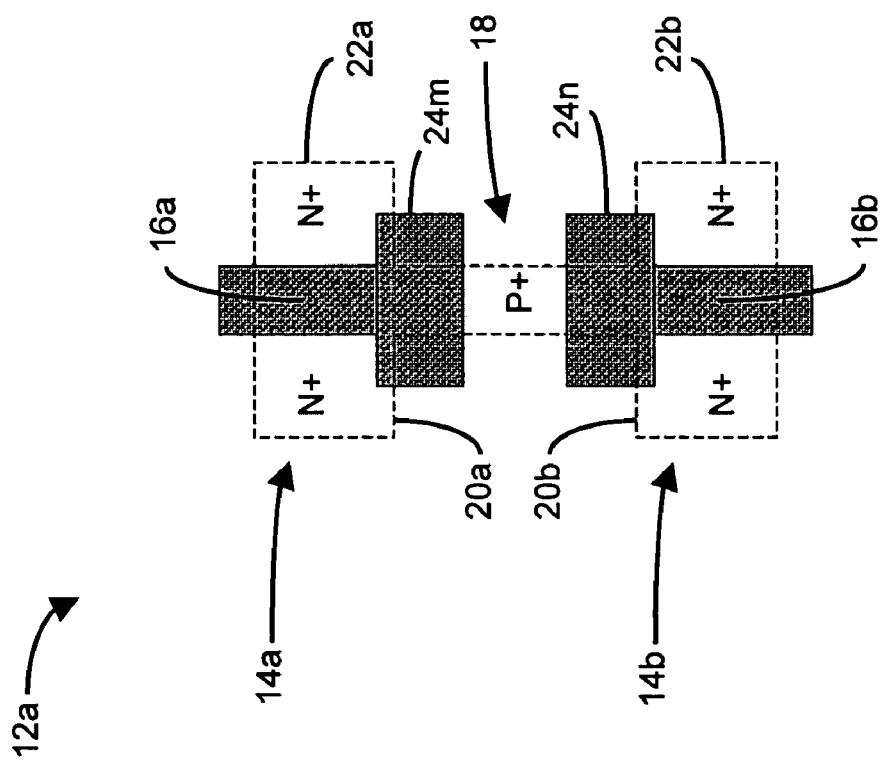
FIG. 29 illustrates an exemplary layout of the dual-port or a multi-port memory cell of FIG. 28.

With reference to FIG. 29, in an exemplary layout, dual port memory cell 12a includes a P+ floating body node 18 that "connects" a P– floating body region under gate 24m of transistor 14a with a P– floating body region under gate 24n of transistor 14b. The gates 24m and 24n are connected to word lines 24m and 24n, respectively. The source regions 20a and 20b are connected to respective source lines. The drain regions 22a and 22b are connected to drain lines. Notably, as mentioned above, although this description includes details directed to N-channel transistors, the inventions (and embodiments hereof are entirely applicable to P-channel transistors. In such embodiments, majority carriers in body region 18 are electrons, and minority carriers are holes.

What is claimed is:

1. A semiconductor memory array, comprising:
a plurality of semiconductor dynamic random access memory cells arranged in a matrix of rows and columns, each semiconductor dynamic random access memory cell includes at least one transistor having:
  a source region;
  a drain region;
  a body region disposed between the source region and the drain region,
wherein the body region is electrically floating; and
  a gate spaced apart from, and capacitively coupled to, the body region;
wherein each memory cell includes (1) a first data state which corresponds to a first charge in the body region of the transistor of the memory cell, and (2) a second data state which corresponds to a second charge in the body region of the transistor of the memory cell; and
wherein the source region of the transistor of each memory cell corresponding to a first row of semiconductor dynamic random access memory cells and a second row of semiconductor dynamic random access memory cells is connected to a first source line, and wherein the first and second rows of memory cells are adjacent rows and the gate of the transistor of each memory cell corresponding to the first row of semiconductor dynamic random access memory cells is connected to a first word line and the gate of the transistor of each memory cell corresponding to the second row of semiconductor dynamic random access memory cells is connected to a second word line; and
wherein one or more predetermined memory cells of the first row are programmed to the second data state by programming each memory cell of the first row to the first data state and thereafter programming the one or more predetermined memory cells of the first row to the second data state.

2. The semiconductor memory array of claim 1 wherein the transistor of each memory cell of the first row of semiconductor dynamic random access memory cells shares a source region with a transistor of an adjacent memory cell of a second row of semiconductor dynamic random access memory cells.

3. The semiconductor memory array of claim 2 wherein the drain region of the transistor of each memory cell of the first row of semiconductor dynamic random access memory cells is connected to a bit line that is different from the bit line of the adjacent memory cell of the second row of semiconductor dynamic random access memory cells.

4. The semiconductor memory array of claim 2 wherein each memory cell of the first row is programmed to the first data state by applying a control signal, having a first amplitude, to the gate of the transistor of each memory cell of the first row, a control signal, having a second amplitude, to the drain region of the transistor of each memory cell of the first row and a control signal, having a third amplitude, to the source region of the transistor of each memory cell of the first row.

5. The semiconductor memory array of claim 4 wherein the one or more predetermined memory cells of the first row are programmed to the second data state by applying (1) a control signal, having a fourth amplitude, to the gate of the transistor of each memory cell of the one or more predetermined memory cells, (2) a control signal, having an fifth amplitude, to the drain region of the transistor of each memory cell of the one or more predetermined memory cells, and (3) a control signal, having a sixth amplitude, to the source region of the transistor of each memory cell of the one or more predetermined memory cells of the first row.

6. The semiconductor memory array of claim 5 wherein an unselected memory cell of the first row is maintained in the first data state, while the one or more predetermined memory cells are programmed to the second data state.

7. The semiconductor memory array of claim 1 wherein the first word line and the second word line are connected.

8. The semiconductor memory array of claim 1 wherein memory cells of the first row of semiconductor dynamic random access memory cells and the second row of semiconductor dynamic random access memory cells are read from or written to simultaneously.

9. A semiconductor memory array, comprising:
a plurality of semiconductor dynamic random access memory cells arranged in a matrix of rows and columns, each semiconductor dynamic random access memory cell includes at least one transistor having:
a source region;
a drain region;
a body region disposed between the source region and the drain region,
wherein the body region is electrically floating; and
a gate spaced apart from, and capacitively coupled to, the body region;
wherein each transistor includes a first state representative of a first charge in the body region, and a second data state representative of a second charge in the body region; and
wherein:
the source region of the transistor of each memory cell corresponding to a first row of semiconductor dynamic random access memory cells is connected to a first source line;
the gate of the transistor of each memory cell corresponding to the first row of semiconductor dynamic random access memory cells is connected to a first word line;
the drain region of the transistor of each memory cell of the first row of semiconductor dynamic random access memory cells is connected to a different bit line; and
the source region of the transistor of each memory cell corresponding to a second row of semiconductor dynamic random access memory cells is connected to the first source line;
the gate of the transistor of each memory cell corresponding to the second row of semiconductor dynamic random access memory cells is connected to a second word line;
the drain region of the transistor of each memory cell of the second row of semiconductor dynamic random access memory cells is connected to a different bit line; and
wherein the first and second rows of semiconductor dynamic random access memory cells are adjacent rows; and
wherein one or more predetermined memory cells of the first row are programmed to the second data state by programming each memory cell of the first row to the first data state and thereafter programming the one or more predetermined memory cells of the first row to the second data state.

10. The semiconductor memory array of claim 9 wherein the transistor of each memory cell of the first row of semiconductor dynamic random access memory cells shares a source region with a transistor of an adjacent memory cell of a second row of semiconductor dynamic random access memory cell.

11. The semiconductor memory array of claim 10 wherein the drain region of the transistor of each memory cell of the first row of semiconductor dynamic random access memory cells is connected to a bit line that is different from the bit line of the adjacent memory cell of the second row of semiconductor dynamic random access memory cells.

12. The semiconductor memory array of claim 11 wherein each memory cell of the first row is programmed to a the first data state by applying control signal, having a first amplitude, to the gate of the transistor of each memory cell of the first row of semiconductor dynamic random access memory cells, a control signal, having a second amplitude, to the drain region of the transistor of each memory cell of the first row of semiconductor dynamic random access memory cells, and a control signal having a third amplitude, to the source region of the transistor of each memory cell of the first row of semiconductor dynamic random access memory cells.

13. The semiconductor memory array of claim 12 wherein the one or more predetermined memory cells of the first row of semiconductor dynamic random access memory cells are programmed to the second data state by applying a control signal, having the fourth amplitude, to the gate of the transistor of each memory cell of the one or more predetermined memory cells, a control signal, having a fifth amplitude, to the drain region of the transistor of each memory cell of the one or more predetermined memory cells, and a control signal, having a sixth amplitude, to the source region of the transistor of each memory cell of the one or more predetermined memory cells.

14. The semiconductor memory array of claim 13 wherein an unselected memory cell of the first row of semiconductor dynamic random access memory cells is maintained in the first data state, while each memory cell of the predetermined memory cells are programmed to the second data state, by applying a control signal, having the fourth amplitude, to the gate of the transistor of the unselected memory cell and a control signal, having an seventh amplitude, to the drain region of the transistor of the unselected memory cell.

15. The semiconductor memory array of claim 9 wherein all of the memory cells of the second row are maintained in an inhibit state while the memory cells of the first row are read.

16. The semiconductor memory array of claim 9 wherein the transistor of each memory cell of the first row of semiconductor dynamic random access memory cells shares a drain region with the transistor of an adjacent memory cell of the second row of semiconductor dynamic random access memory cells.

17. The semiconductor memory array of claim 9 wherein the first word line and the second word line are connected.

18. The semiconductor memory array of claim 9 wherein memory cells of the first row of semiconductor dynamic random access memory cells and the second row of semiconductor dynamic random access memory cells are read from or written to simultaneously.

19. A semiconductor memory array, disposed in or on a semiconductor region or layer which resides on or above an insulating region or layer of a substrate, the semiconductor memory array, comprising:
- a plurality of semiconductor dynamic random access memory cells disposed in or on the semiconductor region or layer and arranged in a matrix of rows and columns, each semiconductor dynamic random access memory cell includes at least one transistor having:
  - a source region;
  - a drain region;
  - a body region disposed between the source region, the drain region and the insulating region or layer of the substrate, wherein the body region is electrically floating; and
  - a gate spaced apart from, and capacitively coupled to, the body region;
- wherein each memory cell includes (1) a first data state which corresponds to a first charge in the body region of the transistor of the memory cell, and (2) a second data state which corresponds to a second charge in the body region of the transistor of the memory cell; and
- wherein the source region of the transistor of each memory cell corresponding to a first row of semiconductor dynamic random access memory cells and a second row of semiconductor dynamic random access memory cells is connected to a first source line, and wherein the first and second rows of memory cells are adjacent rows and the gate of the transistor of each memory cell corresponding to the first row of semiconductor dynamic random access memory cells is connected to a first word line and the gate of the transistor of each memory cell corresponding to the second row of semiconductor dynamic random access memory cells is connected to a second word line; and
- wherein one or more predetermined memory cells of the first row are programmed to the second data state by programming each memory cell of the first row to the first data state and thereafter programming the one or more predetermined memory cells of the first row to the second data state.

20. The semiconductor memory array of claim 19 wherein the transistor of each memory cell of the first row of semiconductor dynamic random access memory cells shares a source region with a transistor of an adjacent memory cell of a second row of semiconductor dynamic random access memory cells, wherein the first and second rows of memory cells are adjacent rows.

21. The semiconductor memory array of claim 20 wherein the drain region of the transistor of each memory cell of the first row of semiconductor dynamic random access memory cells is connected to a bit line that is different from the bit line of the adjacent memory cell of the second row of semiconductor dynamic random access memory cells.

22. The semiconductor memory array of claim 19 wherein the transistor of each memory cell of the first row of semiconductor dynamic random access memory cells shares a drain region with the transistor of an adjacent memory cell of the second row of semiconductor dynamic random access memory cells.

23. The semiconductor memory array of claim 19 wherein the first word line and the second word line are connected.

* * * * *